(12) United States Patent
Lee et al.

(10) Patent No.: US 10,049,947 B2
(45) Date of Patent: Aug. 14, 2018

(54) METHOD OF MANUFACTURING A SUBSTRATE

(71) Applicants: Massachusetts Institute of Technology, Cambridge, MA (US); Nanyang Technological University, Singapore (SG)

(72) Inventors: Kwang Hong Lee, Singapore (SG); Chuan Seng Tan, Singapore (SG); Eugene A. Fitzgerald, Cambridge, MA (US); Eng Kian Kenneth Lee, Singapore (SG)

(73) Assignees: Massachusetts Institute of Technology, Cambridge, MA (US); Nanyang Technological University, Singapore (SG)

( * ) Notice: Subject to any disclaimer, the term of this patent is extended or adjusted under 35 U.S.C. 154(b) by 0 days.

(21) Appl. No.: 15/324,451

(22) PCT Filed: Jul. 6, 2015

(86) PCT No.: PCT/SG2015/050198
§ 371 (c)(1),
(2) Date: Jan. 6, 2017

(87) PCT Pub. No.: WO2016/007088
PCT Pub. Date: Jan. 14, 2016

(65) Prior Publication Data
US 2017/0200648 A1    Jul. 13, 2017

Related U.S. Application Data

(60) Provisional application No. 62/021,810, filed on Jul. 8, 2014.

(51) Int. Cl.
*H01L 21/00* (2006.01)
*H01L 21/8258* (2006.01)
(Continued)

(52) U.S. Cl.
CPC ...... *H01L 21/8258* (2013.01); *H01L 21/0217* (2013.01); *H01L 21/30612* (2013.01);
(Continued)

(58) Field of Classification Search
None
See application file for complete search history.

(56) References Cited

U.S. PATENT DOCUMENTS

2007/0037379 A1    2/2007    Enquist et al.
2007/0042566 A1*    2/2007    Seacrist ............ H01L 21/76254
                                                                                                                                            438/458
(Continued)

FOREIGN PATENT DOCUMENTS

JP    2005322745 A    11/2005
WO    2007019260 A1    2/2007
WO    2010147081 A1    12/2010

OTHER PUBLICATIONS

International Search Report for application No. PCT/SG2015/050198 dated Oct. 6, 2015.
(Continued)

*Primary Examiner* — Reema Patel
(74) *Attorney, Agent, or Firm* — Lerner, David, Littenberg, Krumholz & Mentlik, LLP

(57) ABSTRACT

A method of manufacturing a substrate is disclosed. The method comprises: providing a first semiconductor substrate, which includes an at least partially processed CMOS device layer and a layer of first wafer material; bonding a handle substrate to the partially processed CMOS device layer and removing the layer of first wafer material; providing a second semiconductor substrate having a layer of second wafer material which is different to silicon; bonding the first and second semiconductor substrates to form a combined substrate by bonding the layer of second wafer material to the partially processed CMOS device layer; and
(Continued)

removing the handle substrate from the combined substrate to expose at least a portion of the partially processed CMOS device layer.

18 Claims, 17 Drawing Sheets

(51) Int. Cl.

| | | |
|---|---|---|
| *H01L 27/092* | (2006.01) | |
| *H01L 21/306* | (2006.01) | |
| *H01L 21/762* | (2006.01) | |
| *H01L 21/02* | (2006.01) | |
| *H01L 27/12* | (2006.01) | |
| *H01L 29/20* | (2006.01) | |
| *H01L 29/16* | (2006.01) | |
| *H01L 27/06* | (2006.01) | |

(52) U.S. Cl.
CPC .... *H01L 21/76251* (2013.01); *H01L 27/0635* (2013.01); *H01L 27/092* (2013.01); *H01L 27/1203* (2013.01); *H01L 29/16* (2013.01); *H01L 29/2003* (2013.01)

(56) References Cited

U.S. PATENT DOCUMENTS

| | | | |
|---|---|---|---|
| 2009/0023267 A1 | 1/2009 | Daval et al. | |
| 2009/0142888 A1 | 6/2009 | Tsuchiya | |
| 2009/0233417 A1 | 9/2009 | Akimoto | |
| 2011/0299166 A1 | 12/2011 | Sun | |
| 2012/0248544 A1 | 10/2012 | Yokoyama | |
| 2013/0084689 A1* | 4/2013 | Arriagada | H01L 21/02365 438/478 |
| 2013/0207214 A1 | 8/2013 | Haddad et al. | |
| 2014/0110722 A1* | 4/2014 | Kub | H01L 29/66462 257/77 |
| 2014/0308800 A1* | 10/2014 | Akiyama | H01L 21/02002 438/458 |

OTHER PUBLICATIONS

"The International Technology Roadmap for Semiconductor" www.itrs.net.

D. Christy et al., "Uniform Growth of AlGaN/GaN High Electron Mobility Transistors on 200 mm Silicon (111) Substrate", Applied Physics Express, Feb. 2013, vol. 6, No. 2, 026501.

D. Liang et al., "Recent progress in lasers on silicon", Nature Photonics, Jul. 2010, vol. 4, pp. 511-517.

H. Ko et al., "Ultrathin compound semiconductor on insulator layers for high performance nanoscale transistors", Nature, Nov. 2010, vol. 468, pp. 286-289.

H. S. Lee et al., "Wafer-level heterogenous integration of GaN HEMTs and Si (100) MOSFETs", IEEE Electron Device Letters, Feb. 2012 , vol. 33, No. 2, pp. 200-202.

H. S. P. Wong et al., "Nanoscale CMOS", Proceedings of the IEEE, Apr. 1999, vol. 87, No. 4, pp. 537-570.

J. Nishizawa et al.,"On the reaction mechanisum of GaAs MOCVD", J. Electrochem. Soc., Aug. 1983, vol. 130, No. 2, Aug. 1983, pp. 413-417.

J. Yoon et al., "GaAs photovoltaics and optoelectronics using releasable multilayer epitaxial assemblies", Nature, May 2010, vol. 465, pp. 329-333.

K. Kato et al., "PLC Hybrid Integration Technology and Its Application to Photonic Components", IEEE Journal of Selected Topics in Quantum Electronics, Jan.-Feb. 2000, vol. 6, No. 1, pp. 4-13.

K. Tanabe et al., "Electrically pump 1.3 μm room temperature InAs/GaAs quantum dot lasers on Si substrates by metal-mediated wafer bonding and layer transfer", Optics Express, May 2010, vol. 18, No. 10, pp. 10604-10608.

K. Tanabe et al., "Room temperature continuous wave operation of InAs/GaAs quantum dot photonic crystal nanocavity laser on silicon substrate", Optics Express, Apr. 2009, vol. 17, No. 9, pp. 7036-7042.

L. R. Harriott, "Limits of Lithography", Proceedings of the IEEE, Mar. 2001, vol. 89, No. 3, pp. 366-374.

M. Passlack et al., "High Mobility NMOSFET Structure With High-k Dielectric", IEEE Electron Device Letters, Oct. 2005, vol. 26, No. 10, pp. 713-715.

M. Yokoyama et al., "Formation of III-V-On-Insulator structures on Si by direct wafer bonding", Semiconductor Science and Technology, Sep. 2013, vol. 28, No. 9, 094009.

N. Y. Pacella, "Platform for Monolithic Integration of III-V Devices with Si CMOS Technology", Feb. 2012.

P. Anantha et al.,, "Homogenous chip to wafer bonding of InP-Al2O3-Si using UV/O3 activation", ECS Journal of Solid State Science and Technology, Jan. 2014, vol. 3, No. 4, pp. P43-P47.

R. Kim et al., "Waterproof AlInGaP optoelectronics on stretchable substrates with applications in biomedicine and robotics", Nature Mater. vol. 9, Oct. 2010, pp. 929-937.

R. Zhang et al., "High Mobility Ge pMOSFETs with 0.7 nm Ultrathin EOT using HfO2/Al2O3/GeOx/Ge Gate Stacks Fabricated by Plasma Post Oxidation", in VLSI Technology (VLSIT), Honolulu, HI, Jun. 12-14, 2012, pp. 161-162.

S. Arulkumaran et al., "Demonstration of submicron-gate AlGaN/GaN high electron mobility transistors on silicon with complementary metal oxide semiconductor compatiable non-gold metal stack", Applied Physics Express, Jan. 2013, vol. 6, No. 1, 016501.

S. Deleonibus, "Physical and technical limitations of NanoCMOS devices to the end of the roadmap and beyond" European Physical Journal Applied Physics, Jan. 2007, vol. 36, pp. 197-214.

S. Palit et al., "Low-threshold thin film III-V lasers bonded to Silison with front and back side defined features", Optics Letters, Sep. 15, 2009, vol. 34, No. 18, pp. 2802-2804.

Y. Kamata, "High-k/Ge MOSFETs for future nanoelectronics", Materials Today, Jan.-Feb. 2008, vol. 11, No. 1-2, pp. 30-38.

S. Sugiura et al., "Enhancement-mode n-channel GaN MOSFETs fabricated on p-GaN using HfO2 as gate oxide", Electronic Letters, Aug. 2007, vol. 43, No. 17, pp. 952-953.

T. E. Kazior et al., "More than Moore: GaN HEMTs and Si CMOS Get It Together", 2013 IEEE Compound Semiconductor IC Symposium (CSICS) Technical Digest, Oct. 13-16.

W. E. Hoke et al., "AlGaN/GaN high electron mobility transistors on 100 mm silicon substrates by plasma molecular beam epitaxy", Journal of Vacuum Science & Technology B 29, 2011, 03C107.

W. E. Hoke et al., "Monolithic integration of silicon CMOS and GaN transistors in a current mirror circuit", Journal of Vacuum Science and Technology B, Mar./Apr. 2012, vol. 30, No. 2, 02B101.

Y. Halioua et al., "Hybrid III-V/Si semicondutor / silicon nanolaser", Optics Express, Apr. 2011, vol. 19, No. 10, pp. 9221-9231.

* cited by examiner

US 10,049,947 B2

METHOD OF MANUFACTURING A SUBSTRATE

CROSS REFERENCE TO RELATED APPLICATIONS

The present application is a national phase entry under 35 U.S.C. § 371 of International Application No. PCT/SG2015/050198, filed Jul. 6, 2015, published in English, which claims priority from U.S. Application Ser. No. 62/021,810, filed Jul. 8, 2014, the disclosures of which are hereby incorporated herein by reference.

FIELD & BACKGROUND

The present invention relates to a method of manufacturing a substrate.

Hybrid integration of III-V compound semiconductors and (silicon) CMOS devices on a universal silicon-based platform is a promising approach to introduce new circuit capabilities and associated applications. Conventionally, silicon (Si) and III-V circuits are fabricated and packaged separately, before being assembled on a carrier substrate. But this approach is confronted by interconnect size and losses, which affect performance, form factor, power consumption, cost, and complexity of the assembled circuits.

More specifically, for hybrid integration of III-V and Si circuits, growing III-V materials directly on CMOS devices or Si-based substrates tend to be the simplest approach. However, growth temperature for III-V materials is usually too high to the extent of causing severe damage to the CMOS devices. For example, the growth temperatures for GaAs/InP and GaN are respectively about 650° C. and 1050° C. Also as an example, referring to a hybrid device 100 of FIG. 1, the hybrid integration requires integration of Si (100) on a Si (111) handle substrate through bonding, and specifically, the Si (100) orientation was chosen for the CMOS fabrication and the Si (111) orientation for GaN growth. Further, GaN is grown in recesses arranged on a face of the handle substrate, and so growth uniformity is more difficult to achieve, such that consequently an additional step is required to remove any overgrown GaN on the CMOS transistor area. But more importantly, a thermal budget for growing the GaN should not degrade any CMOS devices already present on the handle substrate and so, Plasma-Assisted Molecular Beam Epitaxy (P-MBE) is used to grow the GaN (i.e. P-MBE requires an operating temperature of 750° C., whereas Metalorganic Vapour Phase Epitaxy (MOCVD) however requires 1050° C.). It is appreciated that the thermal budget needed depends on materials used to manufacture electrodes of the CMOS devices. In modern foundries, the electrodes tend to be formed from cobalt silicide (at least for 0.18 μm technology), which degrades when subjected to a temperature greater than 550° C. and hence damaging the associated CMOS devices.

Alternatively, 3D wafer stacking, which combines bonding and layer transfer, is another way to integrate III-V compound semiconductors on a common Si platform. The reason why 3D integration is appealing is explained below. The device scaling method used in Si-CMOS, which provides a primary driving force for the semiconductor industry to reduce costs per transistor/maintain device performance/lower power consumption, is now reaching fundamental bottlenecks. Further shrinkage of CMOS devices not only makes the CMOS devices unreliable (i.e. due to short channel effects and random fluctuations) but also more expensive (i.e. due to lithography and more processes involved). In addition, the device scaling method is also approaching limits on both the physical-dimension and economical aspects. So to address the problem, 3D wafer stacking, which allows multi-core integration or co-integration with other materials, was proposed.

III-V materials (e.g. GaAs, InGaAs, InP or GaN) tend to have higher electron mobility properties than silicon-based materials. So integration of high speed III-V electronic devices has been proposed to improve performance of mixed-signal chips by integrating high speed/high power III-V FETs/HBTs with CMOS digital circuitries.

Another application is to utilise the optical properties of III-V compound semiconductors. III-V materials may be used as a light source and integrated with optical amplifiers and detectors onto Si chips, or waveguides to further enhance the performance and design flexibility for photonic interconnects. The III-V/Si hybrid devices may also be used as a light source to compensate the inability of silicon to act as a light source, due to silicon's low radiative recombination rate stemming from indirect energy bandgaps.

Fusion bonding of wafers is another useful approach to integrate III-V semiconductors and CMOS devices on a universal platform, in which fusion bonding may be carried out in atmospheric ambient and room temperature. A method to fusion bond Si (100) on GaN/Si wafer has been reported in literature, in which a single bonding process was used, but the method however suffers from some drawbacks: (i). the III-V materials and CMOS devices cannot be processed separately leading to cross-contamination issues, especially in foundries, and (ii). the III-V materials may have problems surviving the employment of high temperature CMOS processing steps. While nitride-based III-V materials may be able to survive the high temperature processing, it is however an issue for arsenide/phosphide-based III-V materials, since the latter start decomposing at about 350° C.

One object of the present invention is therefore to address at least one of the problems of the prior art and/or to provide a choice that is useful in the art.

SUMMARY

According to a $1^{st}$ aspect of the invention, there is provided a method of manufacturing a substrate, comprising: (i) providing a first semiconductor substrate, which includes an at least partially processed CMOS device layer and a layer of first wafer material; (ii) bonding a handle substrate to the partially processed CMOS device layer and removing the layer of first wafer material; (iii) providing a second semiconductor substrate having a layer of second wafer material which is different to silicon; (iv) bonding the first and second semiconductor substrates to form a combined substrate by bonding the layer of second wafer material to the partially processed CMOS device layer; and (v) removing the handle substrate from the combined substrate to expose at least a portion of the partially processed CMOS device layer.

Advantageously, the proposed method enables integration of III-V compound semiconductors and Si-CMOS devices on a common silicon-based platform using 3D wafer stacking to realize a side-by-side hybrid circuit without need to use through-silicon-vias (TSVs). Beneficially, damage to the Si-CMOS devices may be avoided because the III-V materials may be grown separately, from the Si-CMOS devices, in required high temperature environments, without damaging the Si-CMOS devices under those high temperatures.

Preferably, the second wafer material different to silicon may include a group III-V semiconductor material, or a material formed from combining different III-V semiconductor materials.

Preferably, the group III-V semiconductor material may include GaN, InGaP, AlGaAs, InGaAsP, InGaN, AlGaN, GaAs, or InGaAs.

Preferably, the first wafer material may include silicon.

Preferably, the handle substrate may include being formed of silicon.

Preferably, wherein prior to the bonding at step (ii), the method may further comprise performing plasma activation on the first semiconductor substrate and the handle substrate; washing the plasma-activated first semiconductor substrate and handle substrate with a deionized fluid; and drying the washed first semiconductor substrate and handle substrate.

Preferably, the deionized fluid may be deionized water.

Preferably, drying the first semiconductor substrate and handle substrate may include using spin-drying.

Preferably, performing plasma activation may include using a gas plasma on the first semiconductor substrate and the handle substrate.

Preferably, the gas plasma may include nitrogen plasma, oxygen plasma, argon plasma, hydrogen plasma, or helium plasma.

Preferably, the method may further comprise using UV ozone in place of plasma activation on the first semiconductor substrate and the handle substrate.

Preferably, wherein subsequent to step (ii) and prior to step (iv), the method may further comprise annealing the first semiconductor substrate bonded with the handle substrate to increase the bonding strength between the handle substrate and partially processed CMOS device layer.

Preferably, the annealing may be performed using a gas selected from the group consisting of oxygen, hydrogen, nitrogen, forming gas, and argon.

More specifically, the annealing may preferably, be performed using nitrogen at a temperature of about 300° C. and at atmospheric pressure.

Preferably, step (ii) may include removing at least a portion of the layer of first wafer material using mechanical grinding; depositing a layer of protective material on the handle substrate; and etching the first semiconductor substrate bonded with the handle substrate to substantially remove any remaining portions of the layer of first wafer material.

Preferably, the protective material may include ProTEK® B3-25, silicon dioxide or silicon nitride.

Preferably, the method may further comprise removing the protective material from the handle substrate using oxygen plasma configured with a power of about 800 W, subsequent to etching the first semiconductor substrate.

Alternatively, the method may yet further comprise removing the protective material from the handle substrate using acetone, methyl isoamyl ketone or methyl ethyl ketone, subsequent to etching the first semiconductor substrate.

Preferably, etching the first semiconductor substrate may include using wet etching or dry etching.

Preferably, wet etching may include arranging the first semiconductor substrate bonded with the handle substrate to be in a solution of tetramethylammonium hydroxide.

Preferably, the solution may be heated to a temperature of about 80° C.

Preferably, the first semiconductor substrate may include a silicon-on-insulator substrate.

Preferably, the second semiconductor substrate may include a portion formed from a silicon-based material.

Preferably, wherein the first semiconductor substrate at step (i) further includes a first layer of dielectric material arranged intermediate the partially processed CMOS device layer and layer of first wafer material, and wherein step (iv) may include: removing the first layer of dielectric material, subsequent to etching the first semiconductor substrate; depositing a second layer of dielectric material on the partially processed CMOS device layer to replace the removed first layer of dielectric material; and bonding the second layer of dielectric material to the layer of second wafer material of the second semiconductor substrate to form the combined substrate.

Preferably, wherein removing the first layer of dielectric material may include using an etchant for the removal, and the etchant may include hydrofluoric acid.

Preferably, wherein prior to bonding the second layer of dielectric material to the layer of second wafer material, the method may further comprise forming a layer of electrically insulating material on the second layer of dielectric material.

Preferably, wherein subsequent to bonding the second layer of dielectric material to the layer of second wafer material of the second semiconductor substrate, the method may further comprise annealing the combined substrate to increase the bonding strength between the bonded second layer of dielectric material and layer of second wafer material of the second semiconductor substrate.

Preferably, wherein the first semiconductor substrate at step (i) further includes a first layer of dielectric material arranged intermediate the partially processed CMOS device layer and layer of first wafer material, then step (iv) may include depositing a second layer of dielectric material on the layer of second wafer material of the second semiconductor substrate; and bonding the first layer of dielectric material to the second layer of dielectric material to form the combined substrate.

Preferably, wherein prior to bonding the first layer of dielectric material to the second layer of dielectric material, the method may further comprise forming respective layers of electrically insulating material on the first and second layers of dielectric material.

Preferably, wherein subsequent to bonding the first layer of dielectric material to the second layer of dielectric material, the method may further comprise annealing the combined substrate to increase the bonding strength between the bonded first and second layers of dielectric materials.

Alternatively, wherein the first semiconductor substrate at step (i) further includes a first layer of dielectric material arranged intermediate the partially processed CMOS device layer and layer of first wafer material, step (iv) may preferably include removing the first layer of dielectric material, subsequent to etching the first semiconductor substrate; depositing a second layer of dielectric material on the partially processed CMOS device layer to replace the removed first layer of dielectric material; depositing a third layer of dielectric material on the layer of second wafer material of the second semiconductor substrate; and bonding the second layer of dielectric material to the third layer of dielectric material to form the combined substrate.

Yet alternatively, wherein the first semiconductor substrate at step (i) further includes a first layer of dielectric material arranged intermediate the partially processed CMOS device layer and layer of first wafer material, step (iv) may include depositing a second layer of dielectric material on the first layer of dielectric material, subsequent to etching the first semiconductor substrate; depositing a third layer of dielectric material on the layer of second wafer material of the second semiconductor substrate; and bonding the second layer of dielectric material to the third layer of dielectric material to form the combined substrate.

Preferably, wherein prior to bonding the second layer of dielectric material to the third layer of dielectric material, the method may further comprise forming respective layers of electrically insulating material on the second and third layers of dielectric material.

Preferably, the electrically insulating material may include silicon nitride.

Preferably, wherein subsequent to bonding the second layer of dielectric material to the third layer of dielectric material, the method may further comprise annealing the combined substrate to increase the bonding strength between the bonded second and third layers of dielectric materials.

Preferably, depositing the second/third layer of dielectric material may include depositing the second/third layer of dielectric material using Plasma-Enhanced Chemical Vapour Deposition; and planarizing the deposited second/third layer of dielectric material using Chemical Mechanical Polishing.

Preferably, the dielectric material may be selected from the group consisting of aluminium oxide, aluminium nitride, silicon dioxide, synthetic diamond and boron nitride.

Preferably, step (v) may include removing at least a portion of the handle substrate using mechanical grinding; and etching the combined substrate to substantially remove any remaining portions of the handle substrate.

Preferably, step (iii) may include epitaxially growing the layer of second wafer material using Metalorganic Chemical Vapour Deposition or Molecular Beam Epitaxy.

Preferably, step (iv) may include annealing the combined substrate to increase the bonding strength between the layer of second wafer material and the partially processed CMOS device layer.

Preferably, the annealing may be performed using a gas selected from the group consisting of oxygen, hydrogen, nitrogen, forming gas, and argon.

Preferably, wherein the second semiconductor substrate includes a layer of third wafer material arranged adjacent to the layer of second wafer material, and wherein subsequent to step (iv) and prior to step (v), the method may further comprise (vi) removing the layer of third wafer material to expose the layer of second wafer material; (vii) depositing a layer of dielectric material on the exposed second wafer material; (viii) providing at least one further semiconductor substrate having a layer of fourth wafer material which is different to silicon; and (ix) bonding the further semiconductor substrate to the combined substrate by bonding the layer of fourth wafer material to the layer of dielectric material.

Preferably, the third wafer material may include silicon.

Preferably, the fourth wafer material may be same as, or different to the second wafer material.

Preferably, the fourth wafer material different to silicon may include a group III-V semiconductor material, or a material formed from combining different III-V semiconductor materials.

Preferably, the group III-V semiconductor material may include GaN, InGaP, AlGaAs, InGaAsP, InGaN, AlGaN, GaAs, or InGaAs.

Preferably, the further semiconductor substrate may include a layer of dielectric material arranged on the layer of fourth wafer material, and step (ix) may include bonding the layer of dielectric material arranged on the layer of fourth wafer material to the layer of dielectric material deposited on the exposed second wafer material.

Preferably, the method may further include performing densification on the associated deposited layers of dielectric materials, prior to performing the bonding step.

Preferably, the densification may be performed at a temperature between 300° C. to 850° C. in a gaseous environment.

It should be apparent that features relating to one aspect of the invention may also be applicable to the other aspects of the invention.

These and other aspects of the invention will be apparent from and elucidated with reference to the embodiments described hereinafter.

BRIEF DESCRIPTION OF THE DRAWINGS

Embodiments of the invention are disclosed hereinafter with reference to the accompanying drawings, in which:

FIG. 8 includes FIGS. 8a to 8d, in which FIGS. 8a and 8b are IR images of bonded wafer pairs (obtained at the second bonding stage) after being processed to address the pinholes problem by respectively performing Chemical Mechanical Planarization (CMP) on a buried oxide (BOX) layer of the bonded wafer pair, and etching and replacing the BOX layer, whereas FIGS. 8c and 8d are respective IR images corresponding to FIGS. 8a and 8b subsequent to removal of the handle substrate;

FIG. 9 includes FIGS. 9a to 9d, in which FIGS. 9a and 9b are respective IR images of bonded wafer pairs (formed via bonding a PECVD $SiO_2$ layer to another PECVD $SiO_2$ layer) in an "As bonded" state and a "Post bonded annealing" state, whereas FIGS. 9c and 9d are respective IR images of bonded wafer pairs (where an additional $Si_3N_4$ layer is deposited on the respective PECVD $SiO_2$ layers before bonding) in an "As bonded" state and a "Post bonded annealing" state;

DETAILED DESCRIPTION OF PREFERRED EMBODIMENTS

Figure 1:
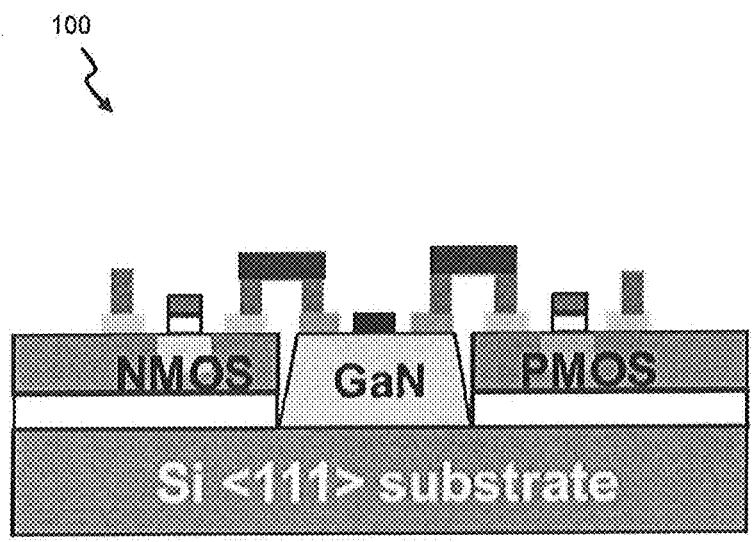
FIG. 1 is a schematic cross-sectional view of a hybrid device, in which GaN is integrated with Si-CMOS on a SOI wafer, according to the prior art.

1. Integration of Patterned SOI with III-V/Si

FIGS. 2a to 2e illustrate various steps for a proposed method 200 of manufacturing a substrate, according to a first embodiment. At step 202, a first semiconductor substrate 250 is provided, which includes (and arranged in the following top-down orientation): an at least partially processed CMOS device layer 252 (e.g. may be 2.1 μm thick, but normally is about 1 μm thick), a layer of dielectric material 254, and a layer of first wafer material 256. The layer of dielectric material 254 is sandwiched between the CMOS device layer 252 and layer of first wafer material 256. In this instance, the layer of dielectric material 254 (which is thermal oxidized) is silicon dioxide (e.g. may be 1.2 μm thick, but normally is about 0.4 μm thick), and is termed buried oxide (BOX) layer hereinafter for simplicity. But it is appreciated that other suitable dielectrics, such as aluminium oxide ($Al_2O_3$), aluminium nitride (AlN), synthetic diamond, boron nitride (BN) or the like, may also be used in place of silicon dioxide to improve thermal conductivity characteristics (for high power applications) and relevant optical properties (for photonics applications). The first wafer material 256 is formed from silicon-based materials, and in this case, is a silicon donor wafer. Also, the definition of partially processed CMOS device layer 252 here means that some basic lithographic patterns may have been made on said device layer 252. As a whole, the first semiconductor substrate 250, may (for example) be a patterned silicon-on-insulator (SOI) substrate (e.g. of about 200 mm size.

At step 204, a handle substrate 258 (e.g. of about 200 mm size) is bonded to the CMOS device layer 252 (e.g. using a wafer bonder) to enable removal of the layer of first wafer material 256. Specifically, the handle substrate 258 is bonded to a surface of the CMOS device layer 252 that is in opposition to another surface where the layer of first wafer material 256 is attached to the CMOS device layer 252. The handle substrate 258 is formed of silicon (e.g. a silicon handle (001) wafer), but does not preclude other suitable materials from being used. It is to be appreciated that prior to performing step 204, the first semiconductor substrate 250 and handle substrate 258 may optionally be plasma activated for about thirty seconds using a nitrogen plasma, megasonic rinsed with a deionized fluid (e.g. deionized water) and then substantially dried (e.g. via spin-drying or using an IPA dryer). Plasma activation is primarily carried out to prepare surfaces of the first semiconductor substrate 250 and handle substrate 258, at an atomic level to be optimal for subsequent bonding. In addition, plasma activation is used to clean and rid surfaces of the first semiconductor substrate 250 and handle substrate 258 of any hydrocarbon contaminants and to "activate" the said surfaces. Nitrogen plasma is selected in this instance for its resultant high bonding strength (compared to oxygen/argon plasma) in a bonding-equipment used in this embodiment. The surface hydrophilicity of the BOX layer 254 is increased (i.e. water droplet surface contact angle smaller than 5°) after the plasma exposure. It is also to be appreciated that in other embodiments, the duration of the plasma activation may be arranged to be anywhere from three seconds to one min (or possibly even longer, depending on the plasma activation device used). The gas used for the plasma activation may also be oxygen, argon, hydrogen or helium. Alternatively, the first semiconductor substrate 250 and handle substrate 258 may instead be treated using UV ozone, rather than using plasma, which still has the same cleaning effect. The megasonic rinsing step not only removes contaminants and cleans the surfaces of the first semiconductor substrate 250 and handle substrate 258, but also populates the associated surfaces with a high density hydroxyl (OH) group to facilitate the bonding at step 204. Step 204 is then carried out after the cleaning, rinsing and drying steps.

Immediately after step 204, the first semiconductor substrate 250 (now bonded with the handle substrate 258) may be annealed to increase and enhance the bonding strength between the handle substrate 258 and the CMOS device layer 252. In particular, the annealing is performed (for about three hours) using nitrogen ambient at a temperature of about 300° C. and at atmospheric pressure. The annealing may also be carried out using other suitable gases such as oxygen ($O_2$), hydrogen ($H_2$), forming gas (a $H_2+N_2$ mixture), and argon (Ar).

At next step 206, the layer of first wafer material 256 is removed from the first semiconductor substrate 250. Particularly, the layer of first wafer material 256 is at least partially removed using mechanical grinding (e.g. until the layer of first wafer material 256 becomes about 50 μm thick), and then followed by depositing (e.g. spin coating) a layer of protective material (e.g. ProTEK® B3-25, silicon dioxide or silicon nitride) on the handle substrate 258. Subsequently, the first semiconductor substrate 250 (bonded with the handle substrate 258) is etched to substantially remove any remaining portions of the layer of first wafer material 256 (that are not removed by the mechanical grinding). In this context, etching includes using wet (chemical) etching or dry etching, wherein wet etching involves arranging the first semiconductor substrate 250 to be submerged in a solution of tetramethylammonium hydroxide (TMAH), until no existence of bubbles is observed. The TMAH solution is heated and maintained at a temperature of about 80° C. for the etching. It is to be appreciated that the BOX layer 254 serves as an etch-stop layer during the wet-etching process. With removal of the layer of first wafer material 256, the first semiconductor substrate 250 is considered as being temporarily transferred to the handle substrate 258. After etching the first semiconductor substrate 250, the protective material is removed from the handle substrate 258 using oxygen plasma configured with a power of about 800 W. Alternatively, the coating of protective material is removable using an appropriate solvent, such as acetone, methyl isoamyl ketone (MIAK) or methyl ethyl ketone (MEK).

At further step 208, a second semiconductor substrate 260 is first provided, which includes (and arranged in the following top-down orientation): a layer of dielectric material 262, a layer of second wafer material 264 (which is different to silicon), and a layer of third wafer material 266. The layer of dielectric material 262 is similar to the BOX layer 254 of the first semiconductor substrate 250, and is deposited on the layer of second wafer material 264 using Plasma-Enhanced Chemical Vapour Deposition (PECVD). So for simplicity sake, the layer of dielectric material 262 is hereinafter referred to as the PECVD $SiO_2$ layer 262. The deposited PECVD $SiO_2$ layer ensures that the surface roughness of the layer of second wafer material 264 is reduced to smaller than 1 nm to facilitate the fusion bonding later carried out at step 208. The layer of third wafer material 266 is simply a silicon-based substrate. The second wafer material 264 is a group III-V semiconductor material, which may include (for example): GaN, InGaP, AlGaAs, InGaAsP, InGaN, AlGaN, GaAs, InGaAs, or any suitable combinations thereof, or the like. So the second semiconductor substrate 260 may also be termed as an III-V/Si (e.g. InGaAs/GaAs/Si or GaN/Si) wafer. It is to be appreciated that provision of the second semiconductor substrate 260 may optionally also be carried out initially at step 202, if desired.

It is to be highlighted that in cases where the second semiconductor substrate 260 is a InGaAs/GaAs/Ge/Si wafer, a 200 mm Si (100) starting substrate with 6° off-cut towards the [110] direction is used. If the second semiconductor substrate 260 is a GaN/Si wafer, a 200 mm Si (111) starting substrate is used instead. Both the InGaAs/GaAs/Ge/Si and GaN/Si wafers may be grown epitaxially using Metalorganic Chemical Vapour Deposition (MOCVD) or Molecular Beam Epitaxy (MBE). Due to the high RMS roughness of the III-V/Si wafer, the PECVD $SiO_2$ layer 262 deposited on the layer of second wafer material 264 serves as a capping layer for planarization process, as well as providing a bonding interface subsequently. Additional densification is carried out (at a suitable temperature between 300° C. to 850° C.) to eliminate any residual gas molecules and by-products incorporated into the PECVD $SiO_2$ layer 262 during the oxide deposition. In this case, the densification process is done at 450° C. for several hours in a nitrogen environment. After densification, the PECVD $SiO_2$ layer 262 is planarized using Chemical Mechanical Planarization (CMP) process. To prepare for the bonding process at step 208, the first semiconductor substrate 250 (obtained at step 206) and the second semiconductor substrate 260 are first positioned relative to each other such that the PECVD $SiO_2$ layer 262 and BOX layer 254 directly face each other. In this embodiment, for illustration purpose, the first semiconductor substrate 250 is positioned above the second semiconductor substrate 260, and so, it will be appreciated that the first and second semiconductor substrates 250, 260 are arranged diametrically to each other in this position. But to generalise, all that is required for the bonding is to bring the PECVD $SiO_2$ layer 262 and BOX layer 254 into contact together and then bonding them (e.g. using, fusion bonding or thermal compression bonding, which can be further strengthened optionally with annealing).

Without loss of generality, at step 208, the first semiconductor substrate 250 is then bonded to the second semiconductor substrate 260 to form a combined substrate 268, which involves bonding the PECVD $SiO_2$ layer 262 and BOX layer 254 together. So in this case, a bonding interface is formed between the BOX layer 254 (of the first semiconductor substrate 250) and the PECVD $SiO_2$ layer 262 (of the second semiconductor substrate 260). The combined substrate 268 may be annealed to increase the bond strength between the PECVD $SiO_2$ layer 262 and BOX layer 254, in which the annealing is performed using a gas selected from the group consisting of oxygen ($O_2$), hydrogen ($H_2$), nitrogen (N), and argon (Ar), but other types of suitable gases may also be used (depending on circumstances) and not limited to the above options stated. So broadly, the bonding step may be viewed as bonding the layer of second wafer material 264 of the second semiconductor substrate to the CMOS device layer 252 of the first semiconductor substrate 250 to form the combined substrate 268, in which the PECVD $SiO_2$ layer 262 and BOX layer 254 serve as a bonding medium/agent.

To clarify, the combined substrate 268 includes the following layers (described in top-down orientation): the handle substrate 258, the CMOS device layer 252, a bonded layer of dielectric material (formed from the BOX layer 254 and PECVD $SiO_2$ layer 262), the layer of second wafer material 264 and the layer of third wafer material 266. It is to be appreciated that a thickness of the layer of second wafer material 264 grown on the second semiconductor substrate 260 may vary as suitably desired, based on requirements of applications intended for the combined substrate 268. Similarly, a thickness of the bonded layer of dielectric material 254, 262 formed may vary as required, by adjusting respective thicknesses of the BOX layer 254 and PECVD $SiO_2$ layer 262 as initially formed, depending on applications intended for the combined substrate 268.

At next step 210, the handle substrate 258 is removed from the combined substrate 268 to expose at least a portion (e.g. an entire surface) of the CMOS device layer 252 providing a final substrate 270, which may be further processed for intended applications. In particular, the handle substrate 258 is removed using mechanical grinding and then the final substrate 270 is wet etched to substantially remove any remaining portions of the handle substrate 258, not removable by the mechanical grinding.

It is to be appreciated that for the proposed method 200, only described steps 202-210 are required as a bare minimum; the other steps are optional or need not be performed as part of the method 200. It will be apparent by now that the method 200 involves a Double Layer Transfer (DLT) process performed respectively at steps 204 and 208. That is, steps 204 and 208 respectively comprise first and second bonding stages. In summary, the method 200 is purposefully devised to utilise 3D wafer stacking for monolithically integrating III-V compound semiconductors and Si-CMOS devices on a common silicon-based platform to realize a side-by-side hybrid circuit without need to use through-silicon-vias (TSVs). That is, the final substrate 270 (at step 210) is a novel hybrid substrate which incorporates Si-CMOS devices and III-V semiconductors on a universal silicon platform. Also, damage to the Si-CMOS devices may be avoided because the III-V materials are grown separately, from the Si-CMOS devices, in desired high temperature environments, without being concerned about damaging the Si-CMOS devices in those high temperatures.

To examine the bonding quality of bonded wafer pairs (i.e. corresponding to the first semiconductor substrate 250 bonded with the handle substrate 258 obtained at step 204, or the combined substrate 268 obtained at step 208), an infrared (IR) camera is used for the investigation. Since the respective bandgaps of Si (i.e. 1.12 ev), GaAs (i.e. 1.42 ev), GaN (i.e. 3.4 ev) and $SiO_2$ (i.e. 8.0 ev) are visible at the IR wavelength, any bonding defects such as voids/particles can easily be detected by shining IR light on one side of a bonded wafer pair (under investigation) and receiving the IR light transmitted through the bonded wafer pair by an IR camera located on the other side of the same bonded wafer pair. IR imaging is able to provide fast, non-destructive investigation, and allow ease of sample handling to determine the bonding quality of bonded wafer pairs. Transmission electron microscopy (TEM) is also used to further study the bonding interface of the bonded wafer pairs.

Figure 3:
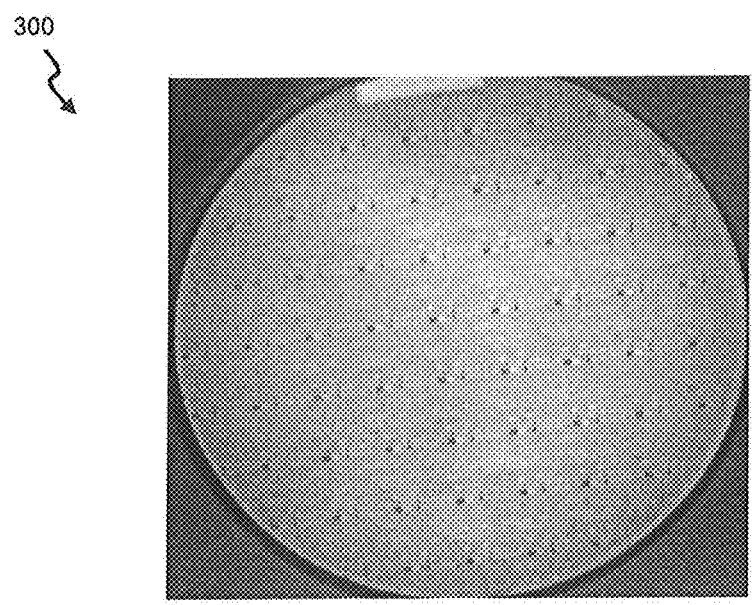
FIG. 3 is an infrared (IR) image of a first bonded wafer pair between a patterned SOI and a handle substrate, obtained at a first bonding stage of the method of FIG. 2.

Accordingly, some experimental results obtained based on the proposed method 200 are discussed below. With reference to FIG. 3, which shows an infrared (IR) image 300 of an example first bonded wafer pair (obtained at the first bonding stage) corresponding to the first semiconductor substrate 250 (i.e. patterned SOI substrate) bonded with the handle substrate 258, it can be seen that the bonding quality of the bonding between the first semiconductor substrate 250 and handle substrate 258 is fairly excellent with no obvious particles or voids observed. Thereafter, the layer of first wafer material 256 (i.e. a silicon donor wafer) of the first bonded wafer pair is mechanically ground down to about less than 50 µm. Subsequently, the TMAH solution is used to wet-etch any remaining portions of the layer of first wafer material 256 completely. It is observed that film delamination issue is found at around 6-7 mm from the edge of the first bonded wafer pair after wet-etching.

Figure 4:
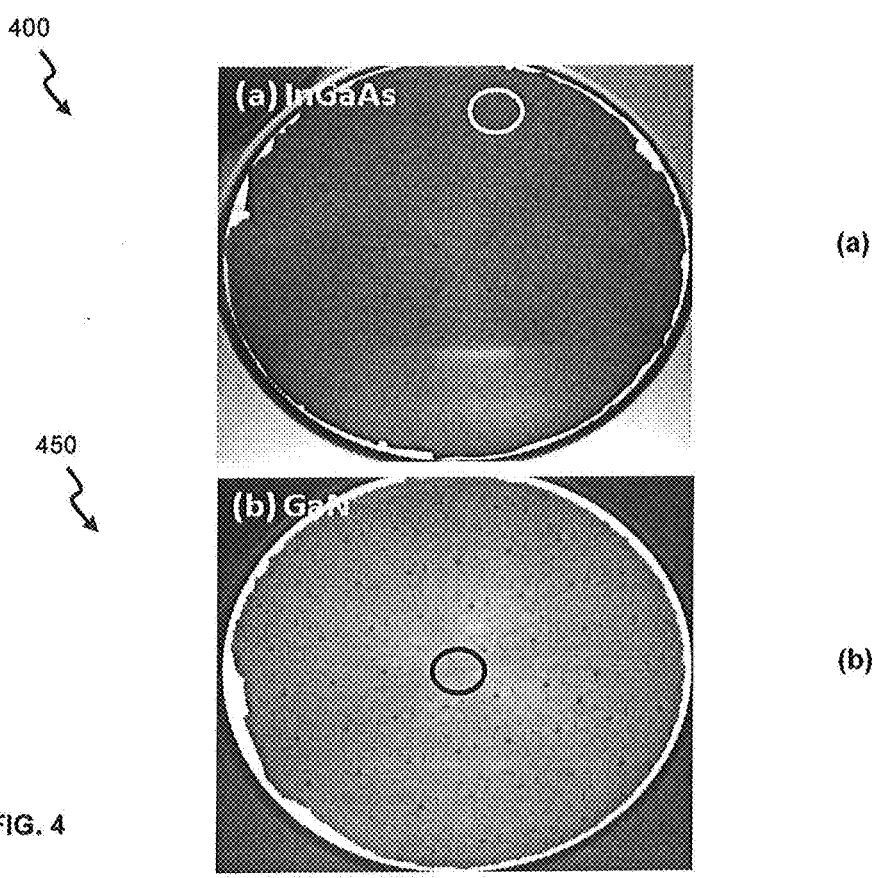
FIG. 4 includes FIGS. 4a and 4b, which are respective IR images of a second bonded wafer pair between a SOI-handle substrate to an InGaAs/GaAs/Ge/Si wafer, and to a GaN/Si wafer, obtained at a second bonding stage of the method of FIG. 2.

Also from FIG. 3, pinholes are observed on the surface of the BOX layer 254, which may be due to the BOX layer 254 being slightly etched by the TMAH solution—i.e. the BOX layer 254 is defective. Although thermal oxide tends to have high etching resistivity to the TMAH solution, the quality of the BOX layer 254 may be sub-standard (i.e. the BOX layer 254 is grown by wet thermal oxidation). Use of Chemical Mechanical Planarization (CMP) is thus proposed to solve the pinholes problem on the surface of the BOX layer 254. Specifically, defective portions of the BOX layer 254 with the pinholes are removed by CMP so that the pinholes are consequently eliminated. After performing CMP, the first bonded wafer pair is cleaned in a RCA solution (i.e. constituted as SC 1, $NH_4OH:H_2O_2:H_2O=1:1:5$ and SC 2, $HCl:H_2O_2:H_2O=1:1:6$). Next, the second bonding stage at step 208 (e.g. between InGaAs/GaAs/Ge/Si to SOI-handle, or GaN/Si to SOI-handle) is carried out to form a second bonded wafer pair (corresponding to the combined substrate 268), and the corresponding results are shown in IR images 400, 450 of FIGS. 4a and 4b. Particularly, some un-bonded areas (i.e. depicted as circled areas in FIGS. 4a and 4b) are observed in the IR images 400, 450 because of the pinholes on the defective BOX layer 254. The whitish regions at the edge of the second bonded wafer pair (seen in FIG. 4a or 4b) are indications where film delamination has occurred due to the TMAH etching and hence no bonding was achieved in those whitish regions.

Figure 5:
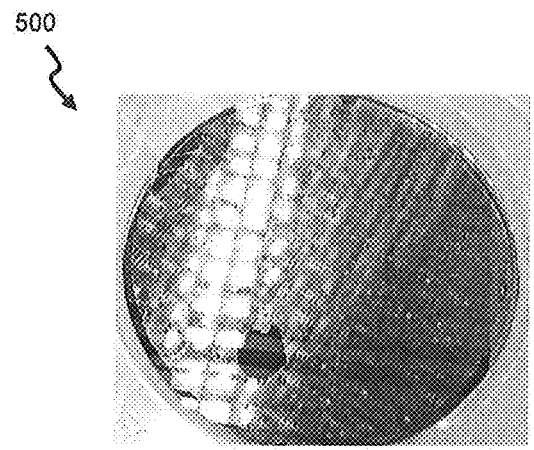
FIG. 5 is an image showing the patterned SOI film peeling off from the SOI-InGaAs/GaAs/Ge/Si wafer of FIG. 4a after the Double Layer Transfer (DLT) process is completed.

Next, the handle substrate 258 is removed by mechanical grinding and wet etching, as above described. Film delamination from (for example) the surface of the SOI-InGaAs/GaAs/Ge/Si wafer is observed, as shown in an image 500 of FIG. 5. It is to be highlighted that the peeling area may be related to the un-bonded areas observed in FIG. 4a. By comparing FIG. 4a and FIG. 5, it is seen that the peeling area is larger than the un-bonded areas because the bonding strength of surrounding areas to the un-bonded areas is weak and thus so, the film is further peeled off to a greater extent when the handle substrate 258 is removed.

Figure 6:
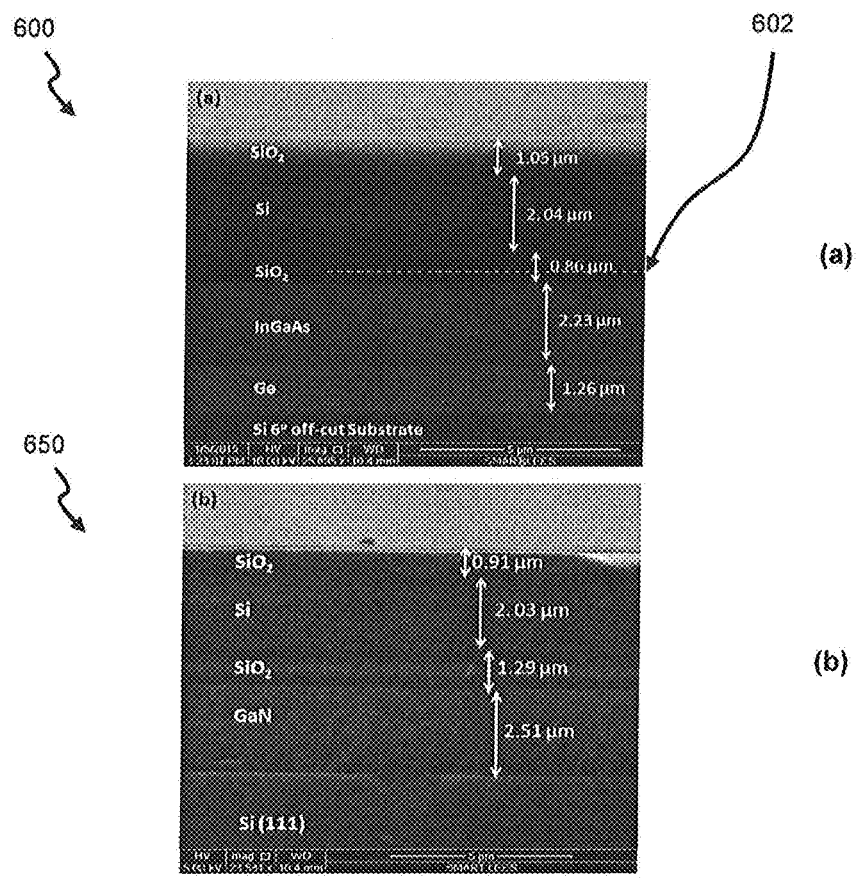
FIG. 6 includes FIGS. 6a and 6b, which are Field Emission Scanning Electron Microscopy (FESEM) micrographs respectively showing corresponding cross-sectional views of a SOI-InGaAs/Ge/Si wafer, and a SOI-GaN/Si wafer.

Field Emission Scanning Electron Microscopy (FESEM) micrographs 600, 650 in FIGS. 6a and 6b respectively show corresponding cross-sectional views of a SOI-InGaAs/Ge/Si wafer and a SOI-GaN/Si wafer after step 210 is completed. For illustration purposes, it is highlighted that a dotted-dashed line 602 in FIG. 6a represents the bonding interface between the BOX layer 254 and the PECVD $SiO_2$ layer 262. However, this bonding interface is not substantially observable in FIG. 6b. It is to be appreciated that FESEM provides a relatively fast and straightforward method to observe the bonded layers without having to prepare thin lamellar film through Focusing Ion Beam (FIB) and ion milling.

Figure 7:
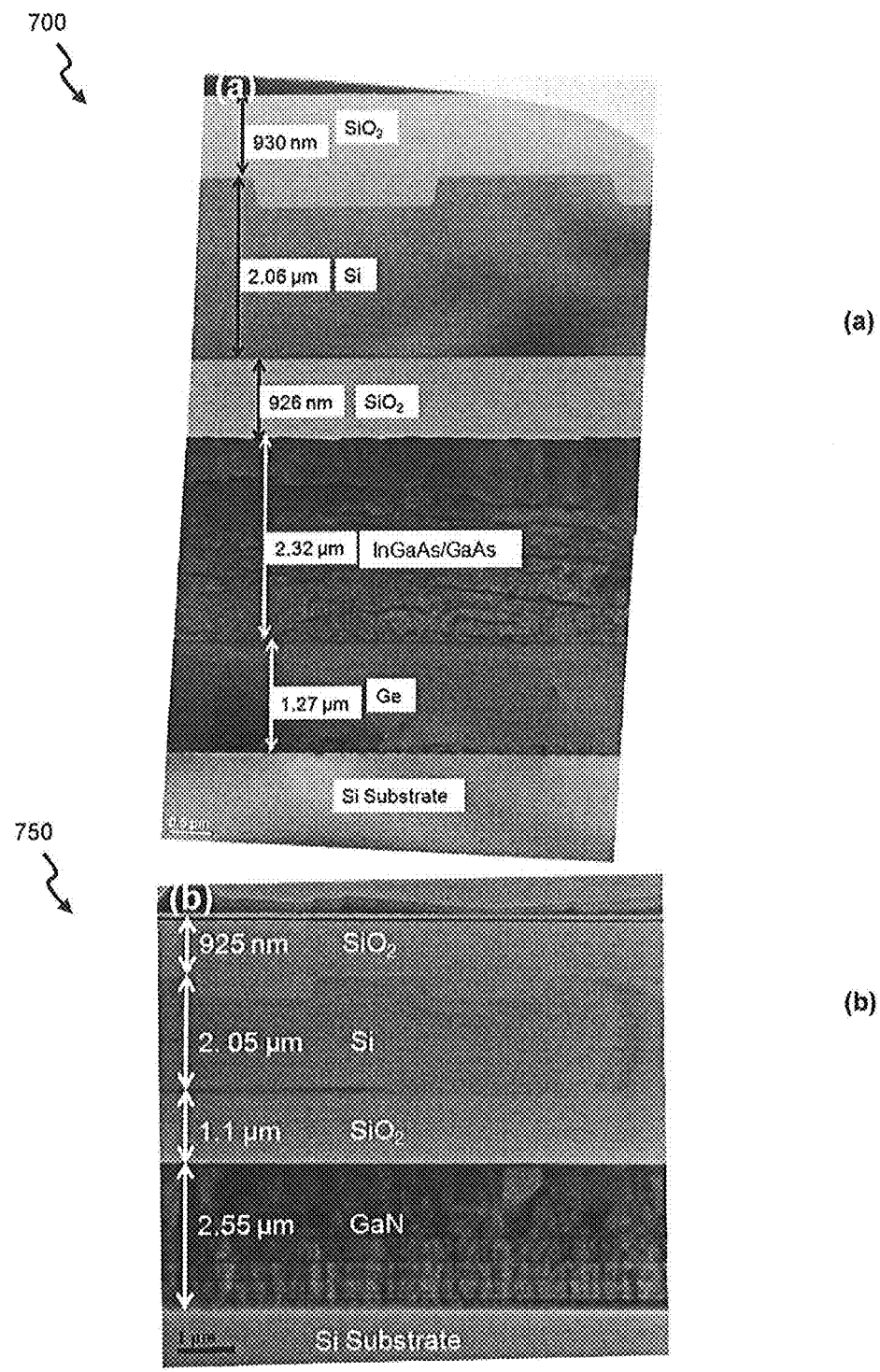
FIG. 7 includes FIGS. 7a and 7b, which are Transmission Electron Microscopy (TEM) images respectively showing corresponding cross-sectional views of a SOI-InGaAs/Ge/Si wafer, and a SOI-GaN/Si wafer.

For a more detailed assessment on the bonding quality between the bonded layers, Transmission Electron Microscopy (TEM) may be used. The cross-sectional views of TEM images 700, 750 in FIGS. 7a and 7b respectively show a SOI-InGaAs/Ge/Si wafer and a SOI-GaN/Si wafer after step 210 is completed. From FIGS. 7a and 7b, no visible microvoids are observed at the bonding interface between the BOX layer 254 and the PECVD $SiO_2$ layer 262, which positively indicates that a uniform and relatively flawless bond has been successfully established on the microscale level.

Figure 2:
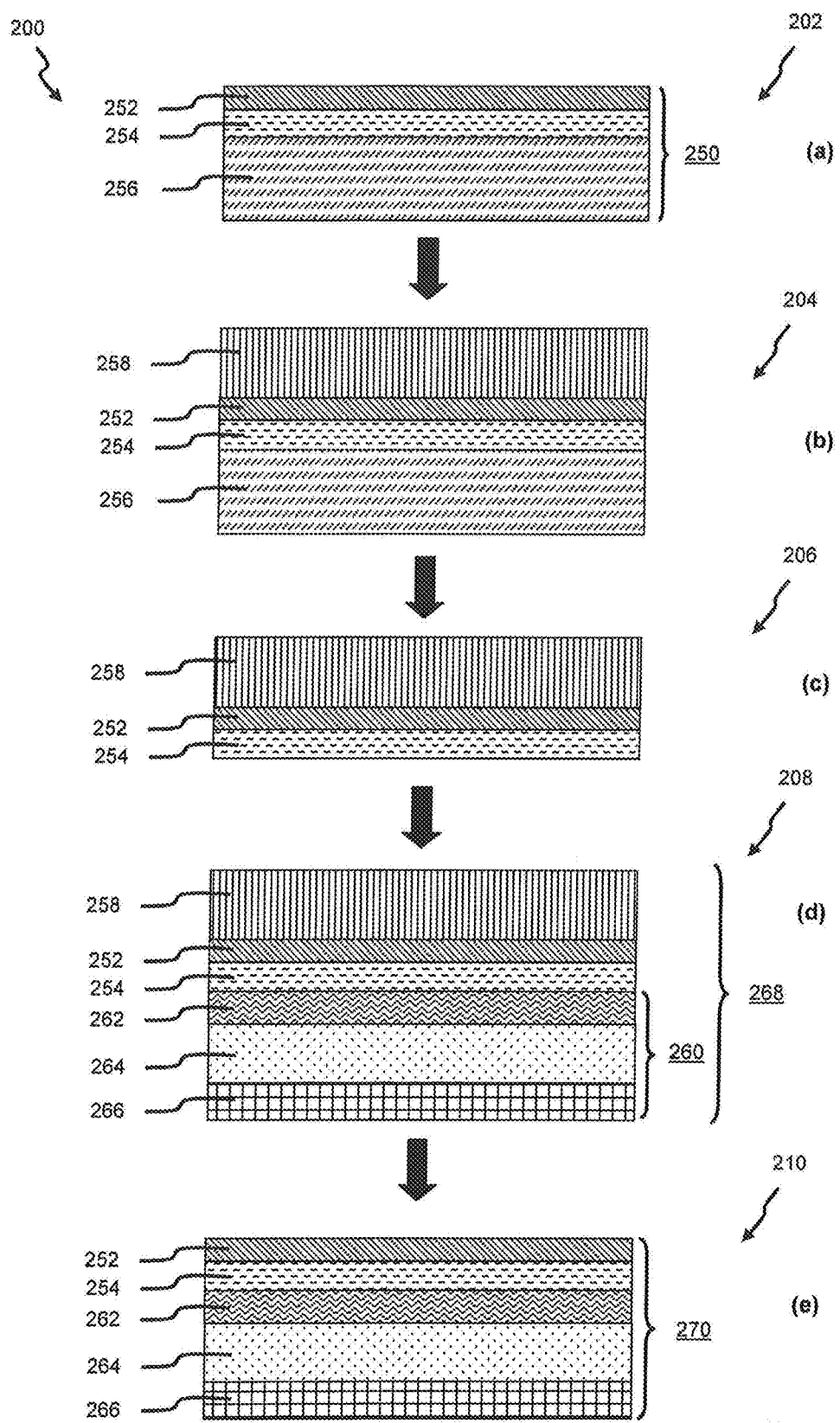
FIG. 2 includes FIGS. 2a to 2e, which depict steps of a method of manufacturing a combined substrate, according to an embodiment.
Figure 13:
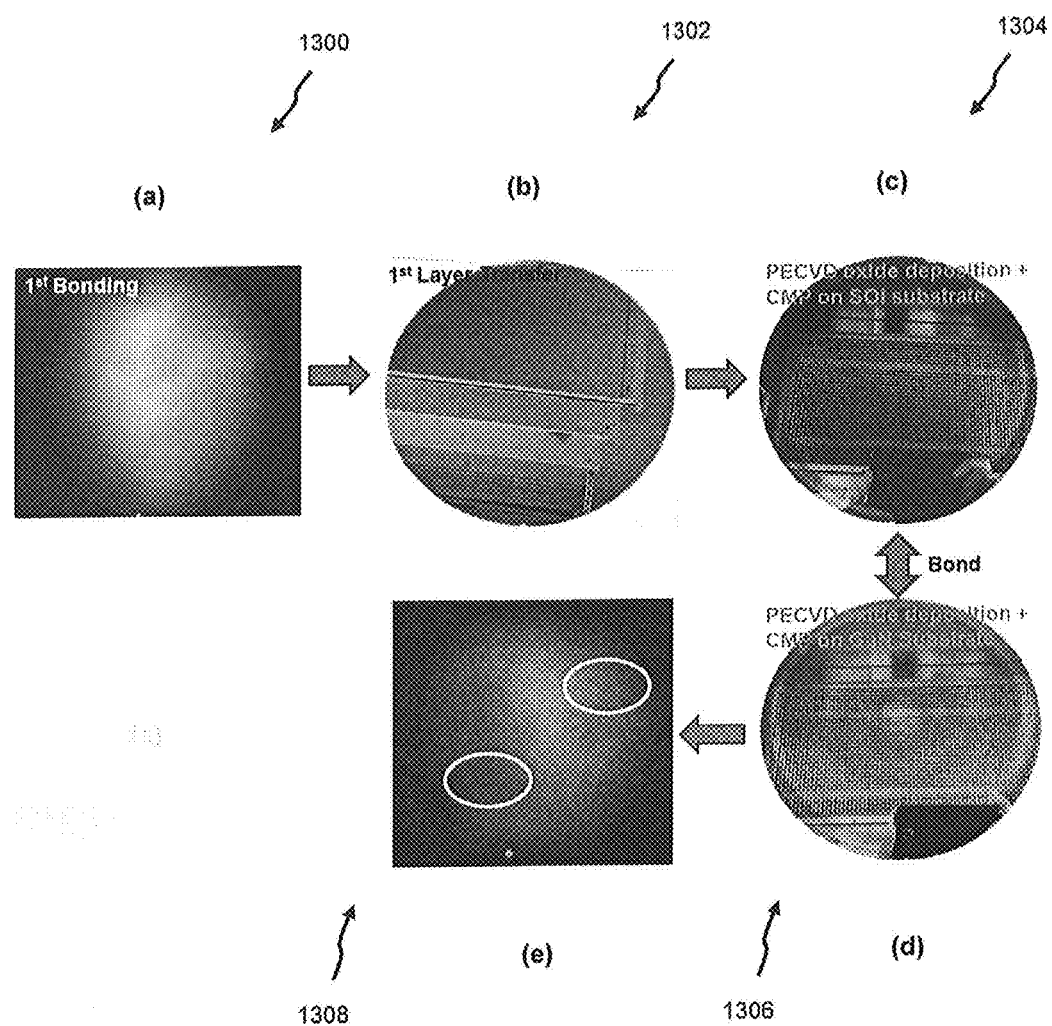
FIG. 13 includes FIGS. 13a to 13e showing respective images of an example substrate processed at various stages of the method of FIG. 2.

Now jumping to FIG. 13, which includes FIGS. 13a to 13e that respectively show images of an example substrate at different processing stages of the method 200 of FIG. 2. Particularly, FIG. 13a is an IR image 1300 corresponding to the first semiconductor substrate 250 bonded with the handle substrate 258 obtained at step 204, FIG. 13b is an IR image 1302 of the first layer transfer, FIGS. 13c and 13d are respective IR images 1304, 1306 of oxide deposition and CMP performance on an SOI substrate and an GaN/Si substrate, and FIG. 13e is an IR image 1308 of the SOI-Si handle wafer bonded to the GaN/Si substrate (where it can be seen that the overall bonding quality is degraded with some trapped particles (i.e. circled areas) between the bonded pair). To briefly clarify, the term "layer transfer" is used interchangeably with the term "bonding", in that bonding a given layer "A" (on a first substrate) to another layer "B" (on a second substrate) may be construed as "transferring" layer "A" from the first substrate to the second substrate.

Briefly, it is to be appreciated that subsequent to removal of the layer of first wafer material 256 from the first semiconductor substrate 250, the BOX layer 254 is now exposed on its front surface. So from FIG. 13b, it can be seen that the exposed BOX layer 254 has a mirror-like surface with very high reflection, indicating good process control was achieved in the mechanical grinding and (TMAH) etching process. In addition, the BOX layer 254 (deposited on the SOI substrate) also has a mirror-like surface with high reflection as shown in FIG. 13c.

Figure 14:
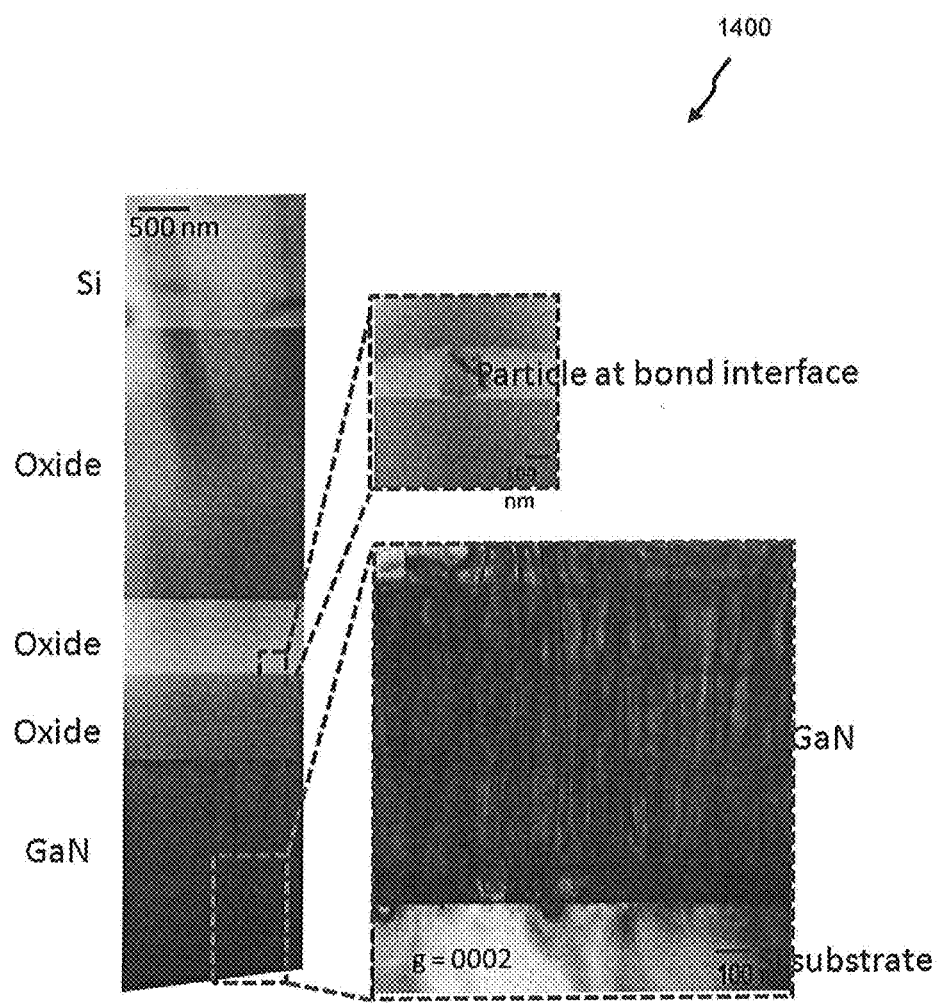
FIG. 14 is a TEM image showing a cross-sectional view of layers of an example substrate obtained via the method of FIG. 2, in which the substrate is an integration of a GaN/Si wafer with a SOI substrate.
Figure 15:
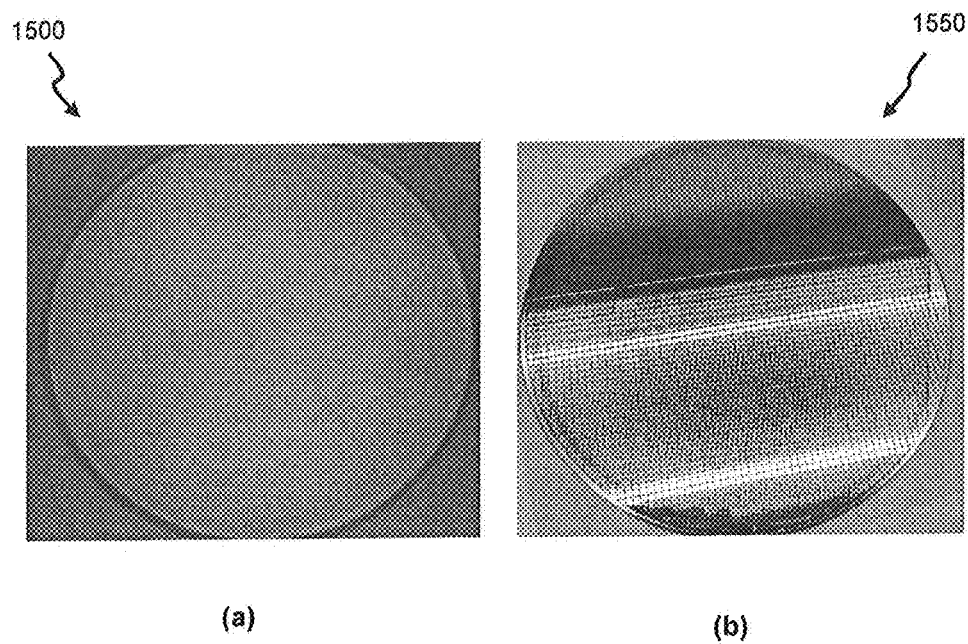
FIG. 15 includes FIGS. 15a and 15b, which are respective IR images of a bonded wafer pair (obtained by the method of FIG. 2) prior and subsequent to removing the handle substrate.

A TEM image 1400 providing a cross-sectional view of respective layers of the SOI-Si handle wafer bonded to the GaN/Si substrate (of FIG. 13e) after the handle substrate is removed is depicted in FIG. 14, where it can be observed that all the layers are bonded uniformly without any visible microvoids. This confirms that a seamless bond at the microscale was successfully formed. The quality of the double bonding and layer transfer is further illustrated in FIGS. 15a and 15b, which are respective IR images 1500, 1550 of the bonded SOI-Si handle wafer with the GaN/Si substrate, prior and subsequent to removing the handle substrate. It is to be appreciated that the overall bonded area is almost about 100% with less than 5 mm of edge exclusion.

Figure 16:
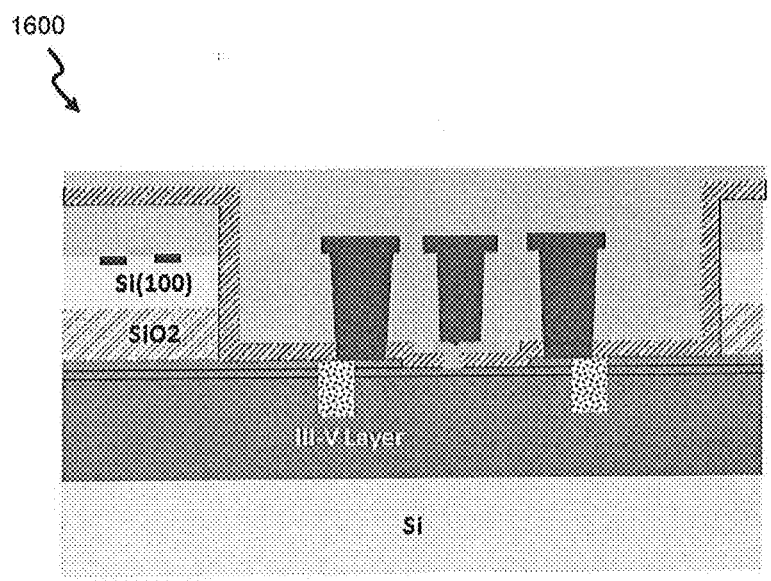
FIG. 16 is a schematic cross-sectional view of CMOS and High Electron Mobility Transistors (HEMT) devices formed adjacent to one another, which may be electrically coupled using Si-CMOS backend processing.

So using the proposed method 200 of FIG. 2, CMOS devices on silicon-based substrates and High Electron Mobility Transistors (HEMTs)/LED devices on III-V substrates may separately be processed in CMOS foundries and SMART (HEMT/LED). Accordingly, as shown in an image 1600 of FIG. 16, the CMOS and HEMT/LED devices are formed and arranged adjacent to another one, and may later be electrically coupled via Si-CMOS backend processing.

The remaining configurations/embodiments will be described hereinafter. For sake of brevity, description of like elements, functionalities and operations that are common between the different configurations/embodiments are not repeated; reference will instead be made to similar parts of the relevant configuration(s)/embodiments.

With reference to sections 2-4, a first variant method 1000 of the method 200 of FIG. 2 is described below, based on a second embodiment.

2. Replacement of BOX Layer by PECVD Oxide Layer

Due to the fact that "CMP on the BOX layer 254" method introduces un-bonded areas in the second bonding stage at step 208, a method to cure the problem relating to the defective BOX layer 254 is proposed herein. In experiments conducted to assess effectiveness of the proposed method, an SOI substrate without pattern (for use as the first semiconductor substrate 250) is adopted, but is not to be construed as limiting. That is for the experiments, the CMOS device layer 252 used is completely unprocessed (but has a dielectric capping layer as will be known in the art), but otherwise, the first semiconductor substrate 250 has the same associated layers as described in the first embodiment. Same as previously, the SOI substrate is bonded to the handle substrate 258. Also, the layer of first wafer material 256 of the present SOI substrate is removed via mechanical grinding and wet (chemical) etching. A hydrofluoric (HF) solution (i.e. constituted as $HF:H_2O=1:10$) is used to substantially remove the defective BOX layer 254 which has a high density of pinholes. Thereafter, a PECVD $SiO_2$ layer is deposited on the CMOS device layer 252, and the deposited PECVD $SiO_2$ layer is smoothed using CMP. For investigation purposes, the resulting first semiconductor substrate 250 with the deposited PECVD $SiO_2$ layer is bonded to another Si substrate (rather than to the second semiconductor substrate 260) to enable analysis and assessment of the proposed method.

Figure 8:
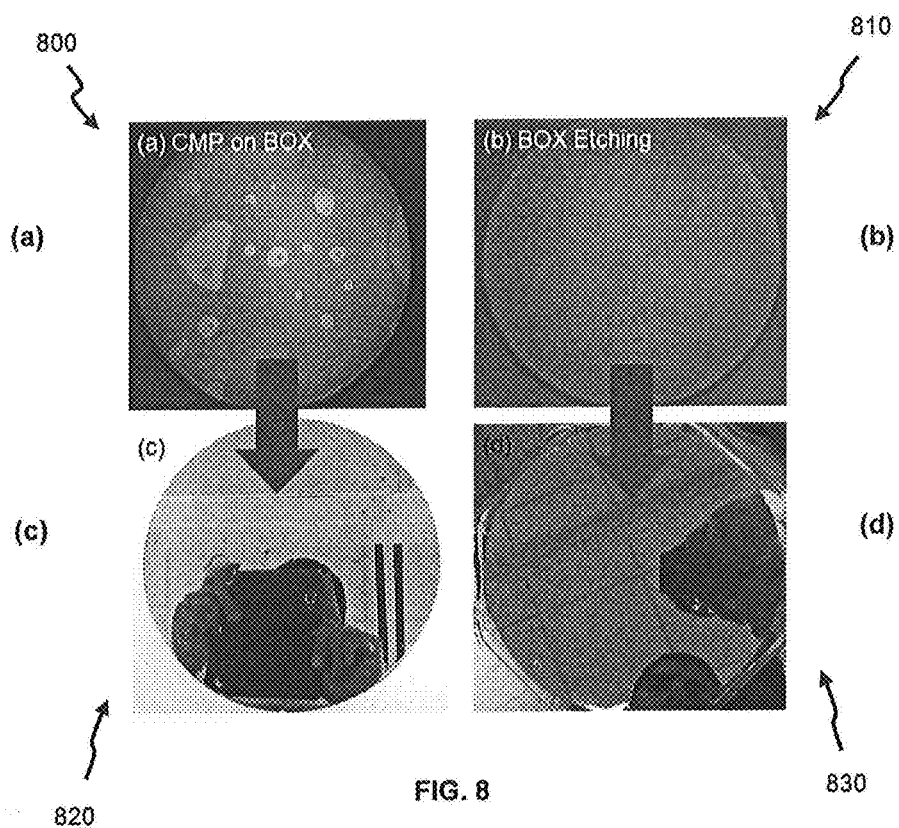

Referring from FIG. 8 hereon, FIGS. 8a and 8b are IR images 800, 810 of bonded wafer pairs (obtained at the second bonding stage) after being processed to address the pinholes problem by respectively performing CMP on the BOX layer 254, and etching and replacing the BOX layer 254, whereas FIGS. 8c and 8d are respective IR images 820, 830 corresponding to FIGS. 8a and 8b subsequent to removing the handle substrate 258. As shown in FIG. 8b, the bonding quality is determined to be satisfactory with no visible particles/voids observed. In addition, no film delamination is observed after the handle substrate 258 is removed.

3. PECVD Oxide Layer to PECVD Oxide Layer Bonding

Figure 9:
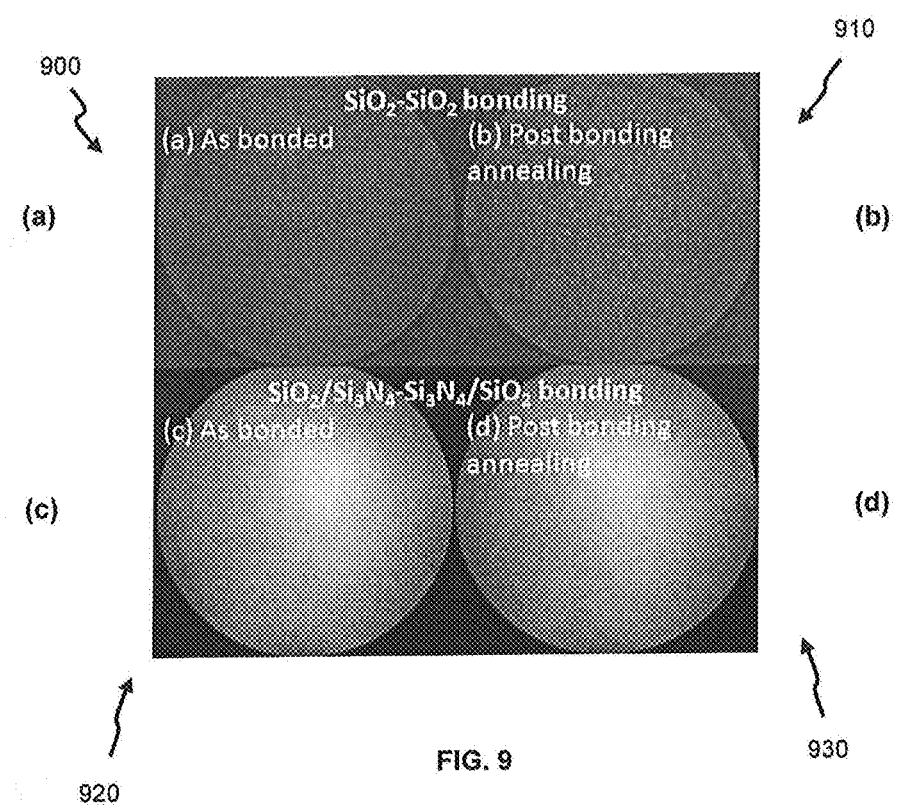

Since the BOX layer 254 is now replaced by a PECVD $SiO_2$ layer, a proposed bonding method to enable PECVD $SiO_2$ layer to PECVD $SiO_2$ bonding layer is hereby disclosed. In experiments conducted to assess effectiveness of the proposed bonding method, only Si substrates are used, and PECVD $SiO_2$ is deposited on respective faces of two separate Si substrates. Same as previously, additional densification is carried out on the deposited PECVD $SiO_2$ layers to drive out any gas molecules or residual by-products that may later cause unsuccessful bonding. After that, the surfaces of the PECVD $SiO_2$ layers are subjected to CMP and subsequently bonded together at room temperature. FIG. 9a shows an IR image 900 of the as-bonded Si substrates. Then, the bonded Si substrates are annealed to further increase the bonding strength. However, a lot of voids are observed after the post-bonding annealing due to the outgassing issue, as shown in a second IR image 910 of FIG. 9b. This is because trapped water ($H_2O$) in the porous PECVD $SiO_2$ layers consequently reacts with the Si—OH to produce silicon dioxide ($SiO_2$) and hydrogen ($H_2$). The hydrogen gas is trapped at the bonding interface and appears in the form of a plurality of voids. In addition, the trapped $H_2O$ in the $SiO_2$ layer evaporates and becomes trapped at the bonding interface in vapour form. So to prevent afore discussed issues, it is proposed that an additional thin layer of electrically insulating material (e.g. $Si_3N_4$) be deposited on the respective PECVD $SiO_2$ layers, and accordingly, corresponding IR images 920, 930 of the as-bonded and post-bonding annealing wafer pairs are respectively shown in FIGS. 9c and 9d. As depicted in FIG. 9d, a void-free bonding is beneficially achievable by coating the PECVD $SiO_2$ layers with respective layers of electrically insulating material.

4. Void-Free Integrated Patterned SOI with III-V/Si

Figure 10:
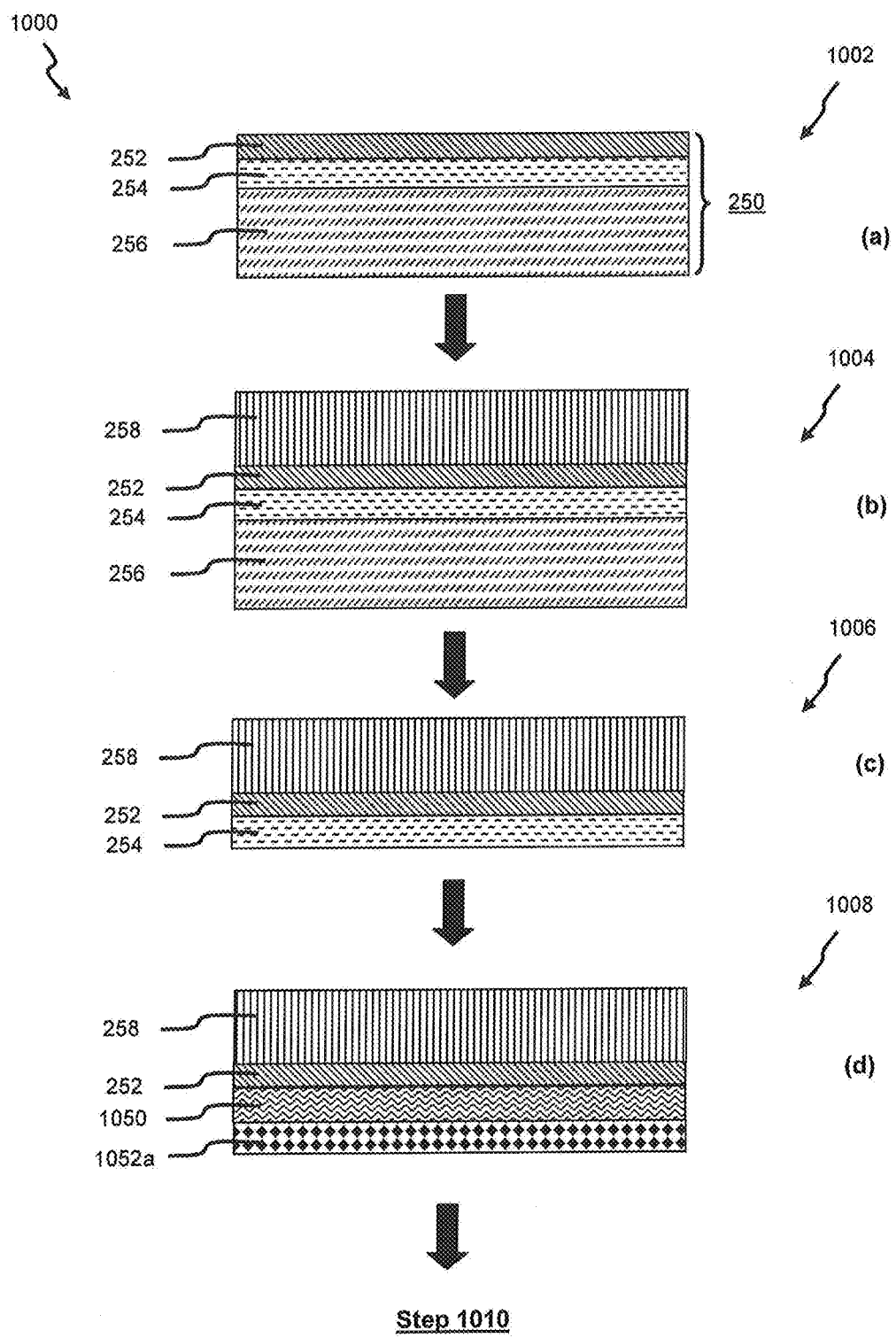
FIG. 10 includes FIGS. 10a to 10f, which depict steps of a method of manufacturing a substrate, according to a different embodiment.
Figure 10:
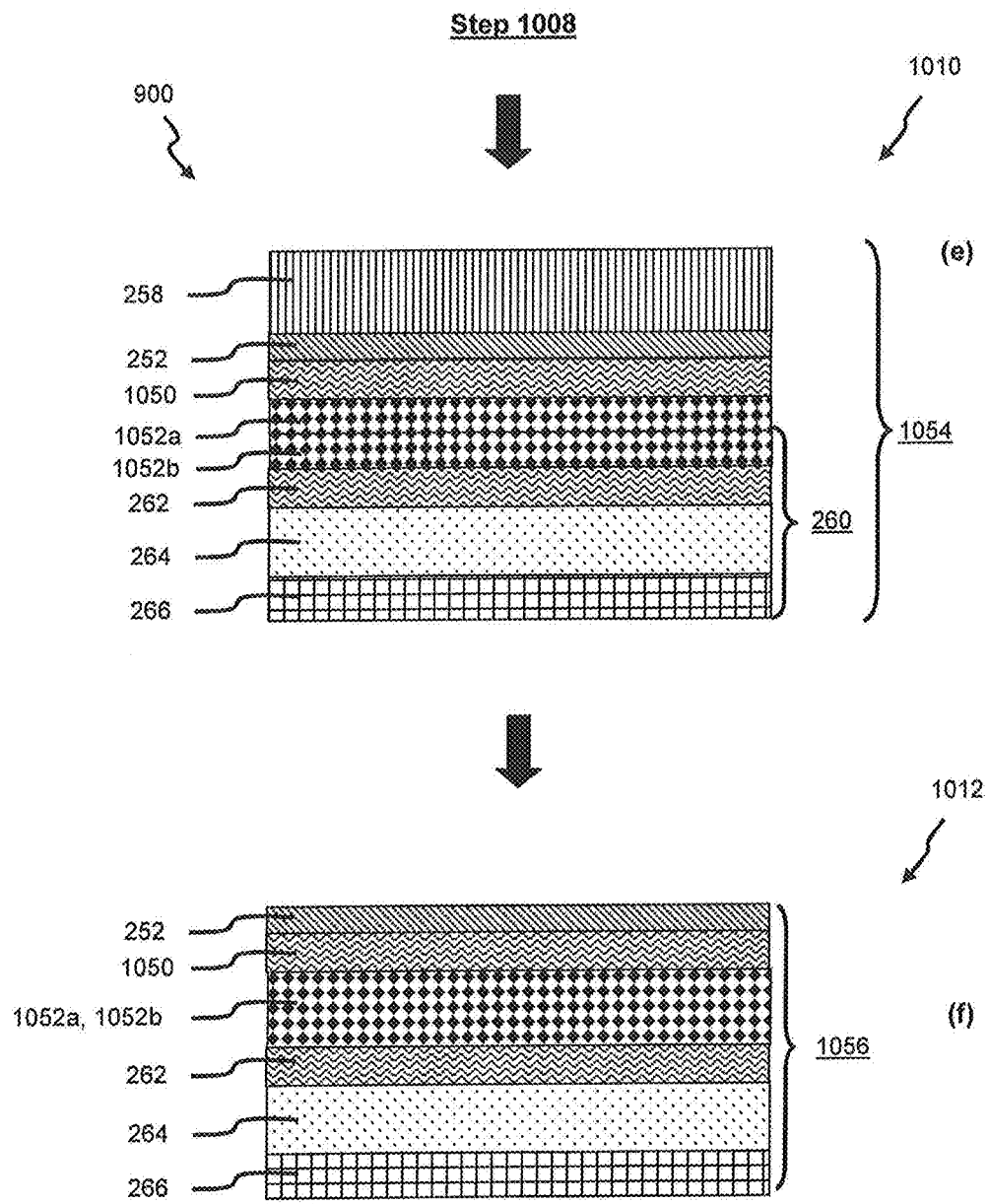

So, the first variant method 1000, which incorporates the proposed methods discussed in sections 2 and 3, is shown in FIG. 10. The variant method 1000 is adapted from the method 200 of the first embodiment, in which steps 1002-1006 are similar to steps 202-206 of method 200 and hence not described again for brevity. At next step 1008, the BOX layer 254 is removed from the CMOS device layer 252 (subsequent to etching the first semiconductor substrate 250 at step 1006), and a layer of dielectric material 1050 (e.g. PECVD $SiO_2$) is deposited on the CMOS device layer 252 to replace the removed BOX layer 254. The layer of dielectric material 1050 may be termed a first PECVD $SiO_2$ layer 1050, and is also to be smoothed using CMP. Then, a first layer of electrically insulating material 1052a (e.g. $Si_3N_4$) is deposited on the first PECVD $SiO_2$ layer 1050.

At further step 1010, the second semiconductor substrate 260 is provided, but with a slight modification effected: a second layer of electrically insulating material 1052b (e.g. $Si_3N_4$) is deposited on the PECVD $SiO_2$ layer 262 layer of the second semiconductor substrate 260 (i.e. a second PECVD $SiO_2$ layer 262). The first and second semiconductor substrates 250, 260 are then bonded together to form a combined substrate 1054, which involves bonding the first and second PECVD $SiO_2$ layers 1050, 262 together. More specifically, the respective surfaces of the first and second PECVD $SiO_2$ layers 1050, 262 deposited respectively with the first and second layers of electrically insulating material 1052a, 1052b are bonded together (and annealing may be further performed if desired). Hence, the bonding interface here is formed between the first and second layers of electrically insulating material 1052a, 1052b. At step 1012, the handle substrate 258 is removed from the combined substrate 1054 to form a final substrate 1056, similar to step 210 as above discussed.

Figure 11:
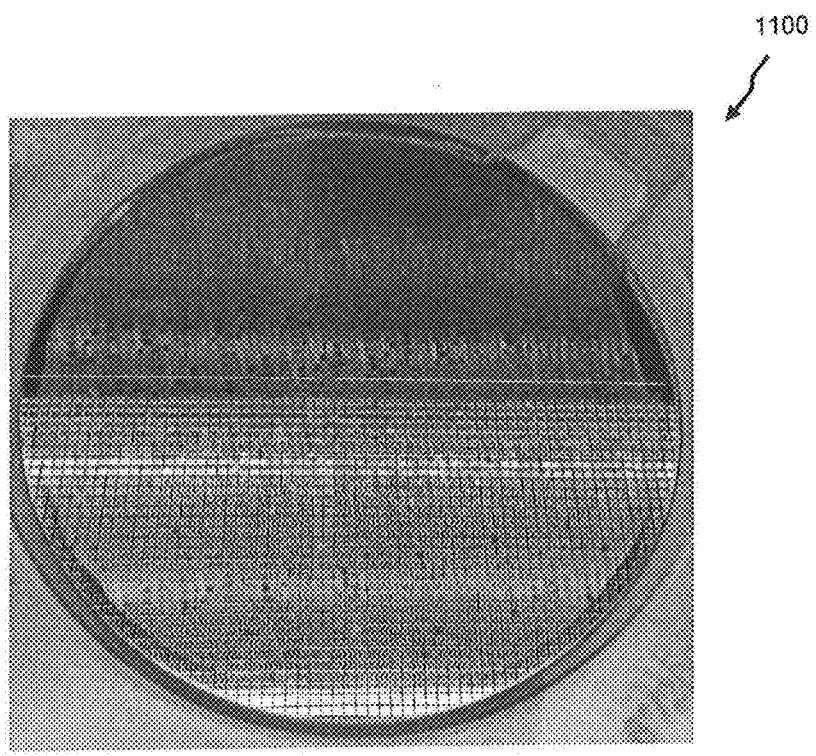
FIG. 11 is an image showing void-free bonding on a patterned SOI on a GaN/Si substrate obtained via the method of FIG. 10.

As shown in an image 1100 of FIG. 11, an example of a void-free patterned SOI on a GaN/Si substrate is obtained via the first variant method 1000, which is devised to address the pinholes and outgassing issues. It is also to be appreciated that through the DLT process, integration of Si-CMOS and III-V compound semiconductors on a common silicon-based platform becomes possible. Merits of the first variant method 1000 include enabling acceptable thermal budget and parallel processing of III-V and CMOS wafers.

Figure 12:
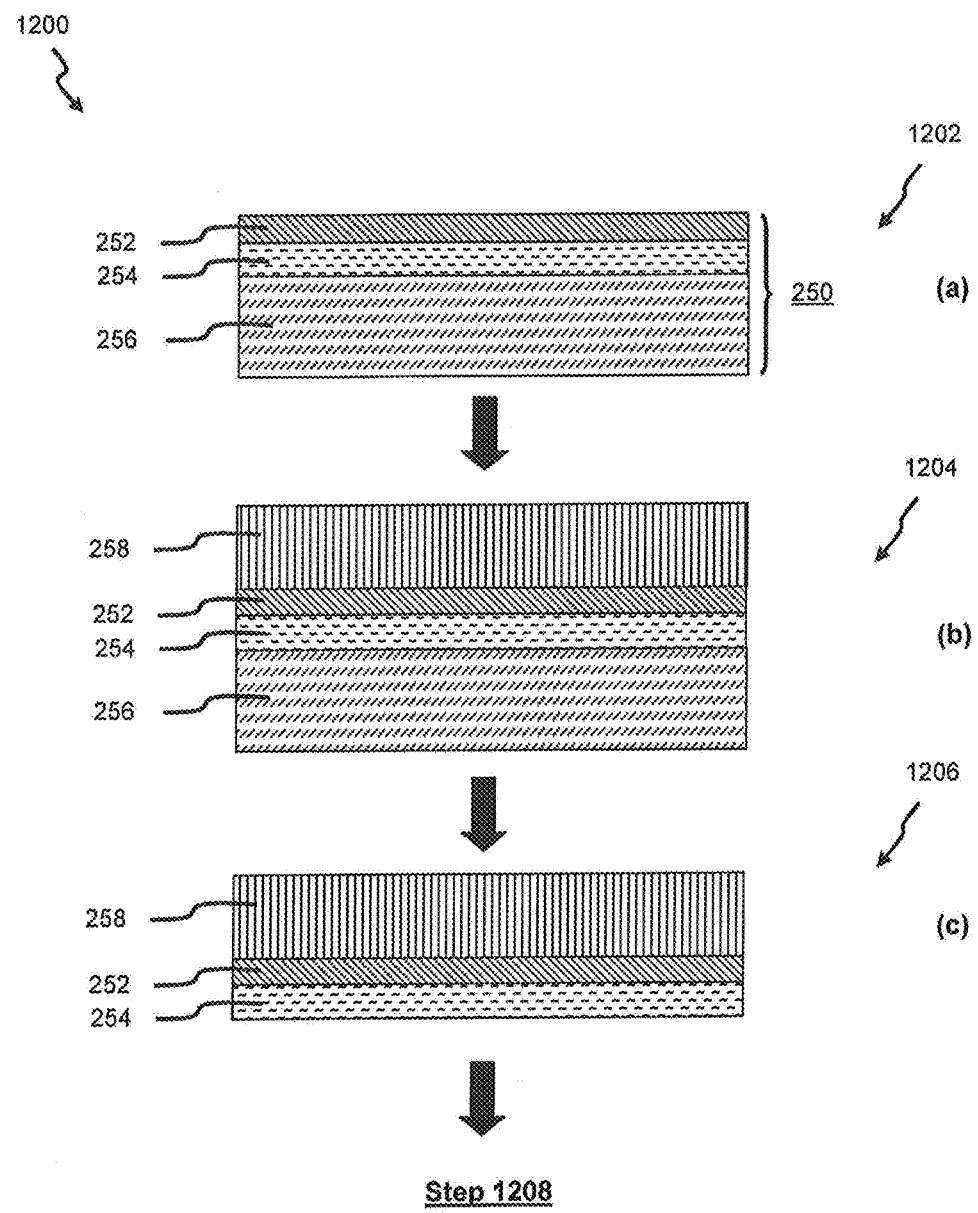
FIG. 12 includes FIGS. 12a to 12f, which depict steps of a method of manufacturing a substrate, according to an alternative embodiment.
Figure 12:
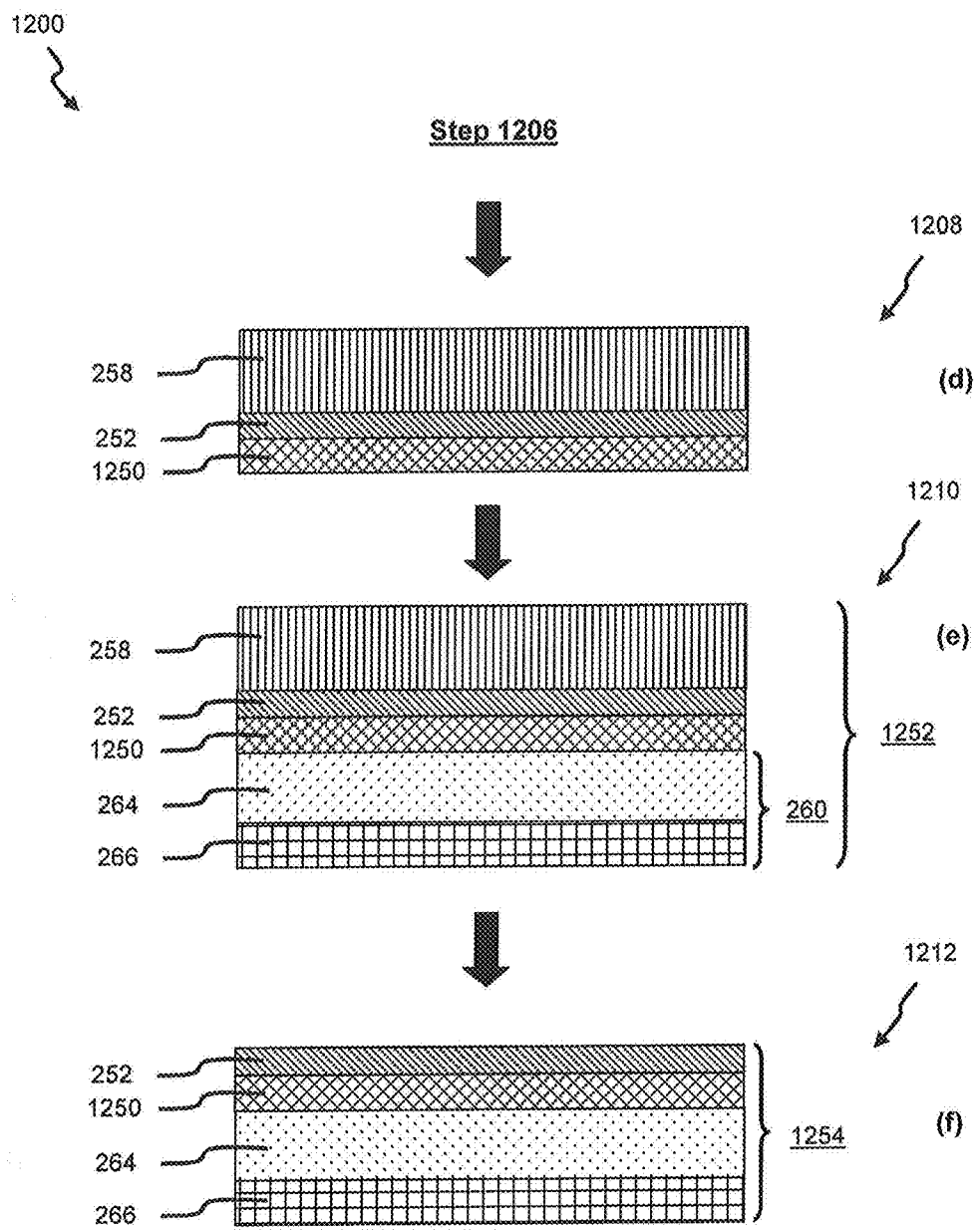

A second variant method 1200 of the method 200 of FIG. 2 is described with reference to FIG. 12, based on a third embodiment. The second variant method 1200 is adapted from the method 200 of the first embodiment, in which steps 1202-1206 are similar to steps 202-206 of method 200 and hence not described for brevity. At next step 1208, the BOX layer 254 is removed (e.g. using an etchant such as the HF solution) from the CMOS device layer 252 (subsequent to etching the first semiconductor substrate 250 at step 1206), since the BOX layer 254 may be slightly over-etched and is thus defective. A layer of dielectric material 1250 (e.g. PECVD SiO$_2$) of a sufficient thickness is next deposited on the CMOS device layer 252 to replace the removed BOX layer 254. The layer of dielectric material 1250 may be termed a PECVD SiO$_2$ layer, and is smoothed by CMP.

At further step 1210, the second semiconductor substrate 260 is provided, but with slight modification: the PECVD SiO$_2$ layer 262 of the second semiconductor substrate 260 previously in the first embodiment is not included in this instance. The first and second semiconductor substrates 250, 260 are then bonded together to form a combined substrate 1252, in which the bonding interface is formed by bonding together the PECVD SiO$_2$ layer 1250 of the first semiconductor substrate 250 with the layer of second wafer material 264 of the second semiconductor substrate 260 (and annealing may be also performed if desired). At step 1212, the handle substrate 258 is removed from the combined substrate 1252 to form a final substrate 1254, similar to step 210 as above discussed.

A third variant method of the method 200 of FIG. 2 is disclosed, in accordance with a fourth embodiment. The third variant method is largely similarly to the method 200 of FIG. 2, except that an additional layer of dielectric material (e.g. PECVD SiO$_2$) is now deposited on top of the BOX layer 254 (which may be defective due to being over-etched at step 206, as previously explained), subsequent to step 206 but prior to step 208. So in step 208, the bonding interface is then formed between the additional layer of dielectric material of the first semiconductor substrate 250 with the PECVD SiO$_2$ layer 262 of the second semiconductor substrate 260.

Figure 17:
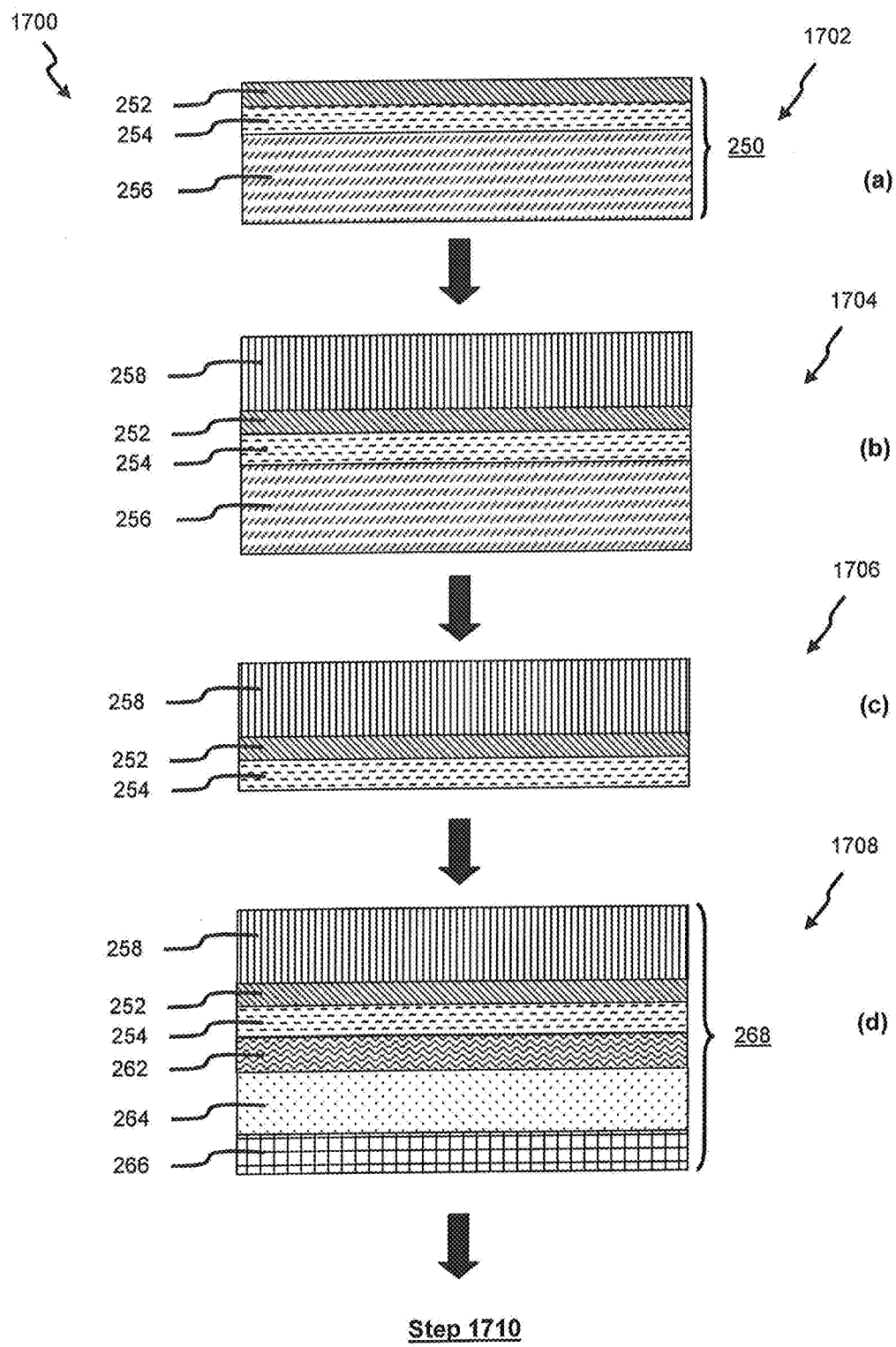
FIG. 17 includes FIGS. 17a to 17h, which depict steps of a method of manufacturing a substrate, according to a further embodiment.
Figure 17:
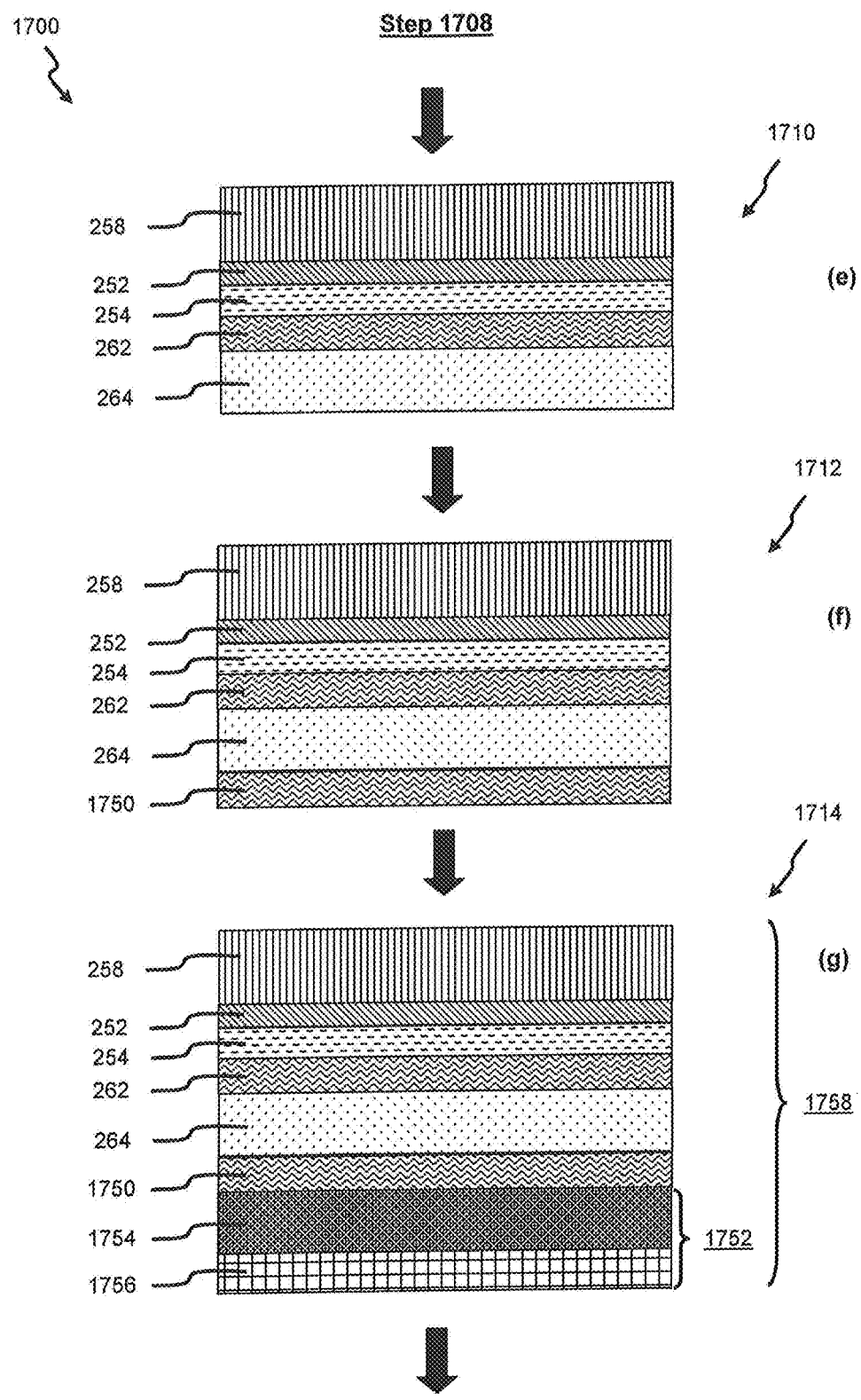
Figure 17:
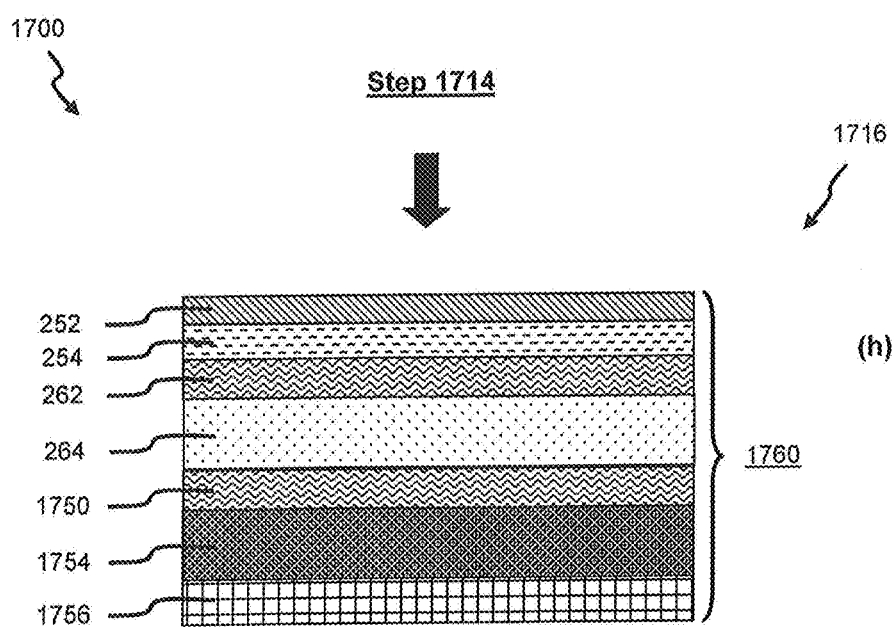

In FIG. 17, a fourth variant method 1700 of the method 200 of FIG. 2 is described, based on a fifth embodiment. The fourth variant method 1700 has steps 1702-1708 are similar to steps 202-208 of method 200 and hence not repeated for brevity. At next step 1710, the layer of third wafer material 266 of the combined substrate 268 is removed (e.g. using a combination of mechanical grinding and etching with the TMAH solution) to expose the layer of second wafer material 264, and at step 1712, another layer of dielectric material 1750 (e.g. PECVD SiO$_2$) is then deposited on the exposed layer of second wafer material 264. At further step 1714, a third semiconductor substrate 1752 is provided, which includes a layer of first wafer material 1754 (which is different to silicon), and a layer of second wafer material 1756. The layer of first wafer material 1754 is a group III-V semiconductor material, which may include (for example): GaN, GaAs, InGaAs or the like. In particular, the layer of first wafer material 1754 may be the same as or different to the layer of second wafer material 264 of the second semiconductor substrate 260, as required. The layer of second wafer material 1756 of the third semiconductor substrate 1752 is a silicon-based substrate. Thereafter at same step 1714, the third semiconductor substrate 1752 is bonded to the combined substrate 268 to obtain a secondary combined substrate 1758, in which the bonding interface is formed between the layer of first wafer material 1754 of the third semiconductor substrate 1752 and the layer of dielectric material 1750 deposited at step 1712. But it is also to be understood this is not to be construed as limiting, since the different various methods of enabling dielectric-to-dielectric bonding to achieve the bonding interface (as disclosed in the previous foregoing embodiments) may alternatively be used, if desired. At step 1716, the handle substrate 258 is removed from the secondary combined substrate 1758 to form a final substrate 1760, similar to step 210 as above discussed. Hence, it is to be appreciated that based on the fourth variant method 1700, as many III-V layers (e.g. three/four layers) as required may accordingly be formed in the same above described manner in the final substrate 1760.

Advantageously, the proposed method 200 (and the various disclosed variants) enables integration of III-V compound semiconductors (e.g. based on InGaAs/GaN) with SOI-CMOS (on SOD on a common silicon-based substrate (e.g. 200 mm diameter) via the DLT process to form a hybrid substrate. To summarise, the SOI-CMOS is first bonded temporarily to a handle substrate to realize a SOI-CMOS-handle substrate, and then an III-V/Si substrate is bonded to the SOI-CMOS-handle substrate. It is to be appreciated that oxide-to-oxide bonding may be used as a bonding medium, but should not be construed as limiting. Other alternative oxide-to-oxide bonding combinations (e.g. thermal SiO$_2$ bond to PECVD SiO$_2$ or PECVD SiO$_2$ bond to PECVD SiO$_2$) are also possible, as discussed. Further to achieve a bonding strength greater than 1000 mJ/cm$^2$, the bonded wafer pair is annealed at 300° C. for about three hours in an atmospheric N$_2$ ambient. Finally, a void free III-V/Si on SOI-CMOS on a common silicon-based substrate may be realized after the handle substrate is released.

To arrive at the foregoing disclosed embodiments, it is to be appreciated that the following bonding types were purposefully investigated to determine their application suitability: (1). PECVD SiO$_2$ with nitride bonded layer to nitride with PECVD SiO$_2$ layer bonding; (2). PECVD SiO$_2$ layer with thermal oxide layer bonding; (3). PECVD SiO$_2$ layer to PECVD SiO$_2$ layer bonding; (4). PECVD SiO$_2$/thermal oxide layer to semiconductor substrate bonding; and (5) semiconductor substrate to semiconductor substrate bonding.

While the invention has been illustrated and described in detail in the drawings and foregoing description, such illustration and description are to be considered illustrative or exemplary, and not restrictive; the invention is not limited to the disclosed embodiments. Other variations to the disclosed embodiments can be understood and effected by those skilled in the art in practising the claimed invention.

For example, the handle substrate 258 may also be deposited on both its opposing surfaces with respective layers of dielectric material (e.g. silicon dioxide), prior to bonding the handle substrate 258 to the CMOS device layer 252 at one of the processed said surfaces. Each layer of the dielectric material deposited is thermally oxidized and may have a thickness of about 100 nm. Also, a thickness of any layer(s) of electrically insulating material/dielectric material deposited on the first/second semiconductor substrates 250, 260 described in any of the above embodiments may vary as desired, depending on applications intended for the associated final substrate formed. Further, the step of depositing a layer of electrically insulating material on a layer of dielectric material to obtain void-free bonding (if required), as disclosed in the second embodiment, will also be understood to be applicable, mutatis mutandis, to the remaining embodiments. In the fourth variant method 1700 of FIG. 17, the third semiconductor substrate 1752 may also already include a layer of dielectric material (e.g. PECVD SiO$_2$) formed on the layer of first wafer material 1754, and thus then, the bonding interface attained at step 1714 is (modified to) alternatively be formed between this layer of dielectric material of the third semiconductor substrate 1752 with the layer of dielectric material 1750 deposited at step 1712.

Yet further, in all afore embodiments described, it is implicitly assumed that the CMOS device layer 252 also comprises a capping dielectric layer (i.e. typically known in the art as an inter-layer dielectric (ILD) or inter-metal dielectric (IMD)), which is arranged on a first face of the CMOS device layer 252 that opposes a second face of the CMOS device layer 252 that is in contact with the BOX layer 254. But however, if the ILD/IMD is not already included with the CMOS device layer 252 at step 202, 1002, 1202 or 1702, the ILD/IMD is then to be deposited on the handle wafer 258, on the first face of the CMOS device layer 252, or on both the handle wafer 258 and first face of the CMOS device layer 252, prior to performance of step 204, 1004, 1204 or 1704.

In addition, it is to be appreciated that the second wafer material 264 or the layer of first wafer material 1754 (described in the fourth variant method 1700) need not always be a group III-V semiconductor material; rather the second wafer material 264 (or the layer of first wafer material 1754) may simply be any suitable material (different to silicon), such as a group IV material (e.g. Ge), appropriate battery/memory materials, organics or II-VI semiconductors, or the like.

Further, the partially processed CMOS device layer 252 may be any kind of SOI, for example from ultra-thin SOI/FDSOI (of about 5-10 nm thickness) all the way to thick/bulk-like layers (of say about 5 μm thickness). Similarly, the BOX layer 254 may have a thickness ranging from about 100 nm to 3 μm. On the other hand, the first wafer material 256, the third wafer material 266 or the layer of second wafer material 1756 of the third semiconductor substrate 1752 may optionally be formed from non-silicon-based materials, such as sapphire-based wafers that would enable Silicon-on-Sapphire (SOS) substrates.

The invention claimed is:

1. A method of manufacturing a substrate, comprising:
 (i) providing a first semiconductor substrate, which includes an at least partially processed CMOS device layer, a layer of first wafer material and a first layer of dielectric material arranged intermediate the partially processed CMOS device layer and layer of first wafer material;
 (ii) bonding a handle substrate to the partially processed CMOS device layer and removing the layer of first wafer material,
 wherein removing the layer of first wafer material includes:
  removing at least a portion of the layer of first wafer material using mechanical grinding;
  depositing a layer of protective material on the handle substrate; and
  etching the first semiconductor substrate bonded with the handle substrate to substantially remove any remaining portions of the layer of first wafer material;
 (iii) providing a second semiconductor substrate having a layer of second wafer material which is different than silicon;
 (iv) bonding the first and second semiconductor substrates to form a combined substrate by bonding the layer of second wafer material to the partially processed CMOS device layer,
 wherein bonding the layer of second wafer material to the partially processed CMOS device layer includes:
  removing the first layer of dielectric material, subsequent to etching the first semiconductor substrate;
  depositing a second layer of dielectric material on the partially processed CMOS device layer to replace the removed first layer of dielectric material; and
  bonding the second layer of dielectric material to the layer of second wafer material of the second semiconductor substrate to form the combined substrate; and
 (v) removing the handle substrate from the combined substrate to expose at least a portion of the partially processed CMOS device layer.

2. The method of claim 1, wherein the second wafer material different than silicon includes a group III-V semiconductor material, or a material formed from combining different III-V semiconductor materials.

3. The method of claim 2, wherein the group III-V semiconductor material includes GaN, InGaP, AlGaAs, InGaAsP, InGaN, AlGaN, GaAs, or InGaAs.

4. The method of claim 1, wherein prior to the bonding at step (ii), further comprising:
 performing plasma activation on the first semiconductor substrate and the handle substrate;
 washing the plasma-activated first semiconductor substrate and handle substrate with a deionized fluid; and
 drying the washed first semiconductor substrate and handle substrate.

5. The method of claim 1, wherein subsequent to step (ii) and prior to step (iv), further comprising annealing the first semiconductor substrate bonded with the handle substrate to increase the bonding strength between the handle substrate and partially processed CMOS device layer using nitrogen at a temperature of about 300° C. and at atmospheric pressure.

6. The method of claim 1, wherein the first semiconductor substrate includes a silicon-on-insulator substrate.

7. The method of claim 1, wherein the second semiconductor substrate includes a portion formed from a silicon-based material.

8. The method of claim 1, wherein prior to bonding the second layer of dielectric material to the layer of second wafer material, further comprising: forming a layer of electrically insulating material on the second layer of dielectric material.

9. The method of claim 1, wherein the first semiconductor substrate at step (i) further includes a first layer of dielectric material arranged intermediate the partially processed CMOS device layer and layer of first wafer material, and wherein step (iv) includes:
 removing the first layer of dielectric material, subsequent to etching the first semiconductor substrate;
 depositing a second layer of dielectric material on the partially processed CMOS device layer to replace the removed first layer of dielectric material;
 depositing a third layer of dielectric material on the layer of second wafer material of the second semiconductor substrate; and
 bonding the second layer of dielectric material to the third layer of dielectric material to form the combined substrate.

10. The method of claim 1, wherein the first semiconductor substrate at step (i) further includes a first layer of dielectric material arranged intermediate the partially processed CMOS device layer and layer of first wafer material, and wherein step (iv) includes:
 depositing a second layer of dielectric material on the first layer of dielectric material, subsequent to etching the first semiconductor substrate;

depositing a third layer of dielectric material on the layer of second wafer material of the second semiconductor substrate; and bonding the second layer of dielectric material to the third layer of dielectric material to form the combined substrate.

11. The method of claim 9, wherein prior to bonding the second layer of dielectric material to the third layer of dielectric material, further comprising:

forming respective layers of electrically insulating material on the second and third layers of dielectric material.

12. The method of claim 8, wherein the electrically insulating material includes silicon nitride.

13. The method of claim 1, wherein the dielectric material is selected from the group consisting of aluminium oxide, aluminium nitride, silicon dioxide, synthetic diamond and boron nitride.

14. The method of claim 1, wherein the second semiconductor substrate includes a layer of third wafer material arranged adjacent to the layer of second wafer material, and wherein subsequent to step (iv) and prior to step (v), further comprising:

(vi) removing the layer of third wafer material to expose the layer of second wafer material;

(vii) depositing a layer of dielectric material on the exposed second wafer material;

(viiii) providing at least one further semiconductor substrate having a layer of fourth wafer material which is different to silicon; and (ix) bonding the further semiconductor substrate to the combined substrate by bonding the layer of fourth wafer material to the layer of dielectric material.

15. The method of claim 14, wherein the fourth wafer material is same as, or different to the second wafer material.

16. The method of claim 14, wherein the fourth wafer material different to silicon includes a group III-V semiconductor material, or a material formed from combining different III-V semiconductor materials.

17. A method of manufacturing a substrate, comprising:

(i) providing a first semiconductor substrate, which includes an at least partially processed CMOS device layer, a layer of first wafer material and a first layer of dielectric material arranged intermediate the partially processed CMOS device layer and layer of first wafer material;

(ii) bonding a handle substrate to the partially processed CMOS device layer and removing the layer of first wafer material;

(iii) providing a second semiconductor substrate having a layer of second wafer material which is different than silicon;

(iv) bonding the first and second semiconductor substrates to form a combined substrate by bonding the layer of second wafer material to the partially processed CMOS device layer, wherein bonding the layer of second wafer material to the partially processed CMOS device layer includes:

depositing a second layer of dielectric material on the layer of second wafer material of the second semiconductor substrate; and bonding the first layer of dielectric material to the second layer of dielectric material to form the combined substrate; and (v) removing the handle substrate from the combined substrate to expose at least a portion of the partially processed CMOS device layer.

18. The method of claim 17, wherein prior to bonding the first layer of dielectric material to the second layer of dielectric material, further comprising:

forming respective layers of electrically insulating material on the first and second layers of dielectric material.

* * * * *